(12) United States Patent
Yim

(10) Patent No.: US 12,431,042 B2
(45) Date of Patent: Sep. 30, 2025

(54) DISPLAY DEVICE

(71) Applicant: Samsung Display Co., LTD., Yongin-si (KR)

(72) Inventor: Dale Yim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 241 days.

(21) Appl. No.: 18/233,258

(22) Filed: Aug. 11, 2023

(65) Prior Publication Data

US 2024/0194096 A1 Jun. 13, 2024

(30) Foreign Application Priority Data

Dec. 7, 2022 (KR) .................. 10-2022-0169926

(51) Int. Cl.
*G09F 9/30* (2006.01)
*G02B 30/40* (2020.01)
(Continued)

(52) U.S. Cl.
CPC ........ *G09F 9/301* (2013.01); *G02F 1/133305* (2013.01); *G03H 1/0005* (2013.01); *G03H 1/04* (2013.01); *H10K 59/751* (2023.02); *H10K 59/878* (2023.02); *H10K 59/90* (2023.02); *G02B 30/40* (2020.01); *G02F 1/1334* (2013.01); *G03H 2001/0088* (2013.01); *G06F 1/1641* (2013.01);
(Continued)

(58) Field of Classification Search
CPC ...... G09F 9/301; H10K 59/751; H10K 59/90; H10K 59/878; H10K 77/10; H10K 2102/3031; G02F 1/133305; G02F 1/1334; G03H 1/0005; G03H 1/04; G03H 2001/0088; G02B 30/40; G06F 1/1641
USPC ........................................................... 359/23
See application file for complete search history.

(56) References Cited

U.S. PATENT DOCUMENTS 4,064,662 A * 12/1977 O'Toole .................. E04B 1/345
                                                    229/116
4,973,139 A * 11/1990 Weinhrauch ....... G02B 27/0101
                                                    359/601

(Continued)

FOREIGN PATENT DOCUMENTS

KR     10-2017-0067098 A      6/2017
KR     10-2017-0073119 A      6/2017
KR        20210117418 A   *  9/2021

*Primary Examiner* — Allen L Parker
*Assistant Examiner* — Martin Antonio Asmat Uceda
(74) *Attorney, Agent, or Firm* — Womble Bond Dickinson (US) LLP

(57) ABSTRACT

A display device including a first non-folding area, a second non-folding area, a third non-folding area, and a fourth non-folding area, and is that configured to be in-folded based on folding lines between the first non-folding area, the second non-folding area, the third non-folding area, and the fourth non-folding area, the display device including: a display panel including a light transmission display area in a portion of the first to third non-folding areas, and a light blocking display area in remaining areas of the first to third non-folding areas; a light transmission control layer in the light blocking display area; and a main processor configured to control the light transmission control layer and the display panel, wherein the main processor is configured to output a flat image in a first mode and to display a hologram image in a second mode.

20 Claims, 29 Drawing Sheets

(51) Int. Cl.
    *G02F 1/1333*     (2006.01)
    *G02F 1/1334*     (2006.01)
    *G03H 1/00*     (2006.01)
    *G03H 1/04*     (2006.01)
    *G06F 1/16*     (2006.01)
    *H10K 59/00*     (2023.01)
    *H10K 59/80*     (2023.01)
    *H10K 59/90*     (2023.01)
    *H10K 77/10*     (2023.01)
    *H10K 102/00*     (2023.01)

(52) U.S. Cl.
    CPC ..... *H10K 77/10* (2023.02); *H10K 2102/3031* (2023.02)

(56) References Cited

U.S. PATENT DOCUMENTS

| | | | | |
|---|---|---|---|---|
| 5,594,559 A * | 1/1997 | Sato | ............ | G03H 1/22 359/9 |
| 7,012,745 B2 * | 3/2006 | Ishikawa | ............ | G02B 3/0068 348/E13.028 |
| 7,110,796 B2 * | 9/2006 | Lee | ............ | H04M 1/0247 345/32 |
| 7,234,253 B2 * | 6/2007 | Ossmann | ............ | G09F 27/00 40/124.14 |
| 8,764,206 B2 * | 7/2014 | Vilardell | ............ | G06F 1/1637 361/679.04 |
| 8,970,478 B2 * | 3/2015 | Johansson | ............ | H04N 13/156 348/51 |
| 9,279,990 B2 * | 3/2016 | Chen | ............ | H04N 13/31 |
| 9,563,173 B2 * | 2/2017 | Kim | ............ | H04N 23/63 |
| 9,581,814 B2 * | 2/2017 | Nowatzyk | ............ | G03H 1/0248 |
| 9,618,760 B2 * | 4/2017 | Cornford | ............ | G02B 30/37 |
| 9,946,225 B2 * | 4/2018 | Murphy | ............ | G03H 1/2202 |
| 10,499,032 B2 * | 12/2019 | Chen | ............ | H04N 13/128 |
| 10,642,220 B2 * | 5/2020 | Zhang | ............ | G02B 27/04 |
| 10,757,375 B2 * | 8/2020 | Yoshii | ............ | H04N 7/18 |
| 10,825,367 B2 * | 11/2020 | Kim | ............ | G09G 3/3208 |
| 11,258,890 B2 * | 2/2022 | Griffith | ............ | G03B 21/10 |
| 11,442,304 B2 * | 9/2022 | Okita | ............ | G02F 1/13338 |
| 11,707,671 B2 * | 7/2023 | Abdelkarim | ............ | G09G 3/003 463/32 |
| 11,792,311 B2 * | 10/2023 | Griffith | ............ | G03B 21/28 455/556.1 |
| 11,899,398 B1 * | 2/2024 | Tian | ............ | G09F 19/18 |
| 12,265,357 B2 * | 4/2025 | Hart | ............ | G03H 1/0248 |
| 2005/0185276 A1 * | 8/2005 | Tomisawa | ............ | H04N 13/307 348/E13.028 |
| 2006/0145947 A1 * | 7/2006 | Arneson | ............ | H04M 1/0245 345/32 |
| 2006/0256144 A1 * | 11/2006 | Chung | ............ | G06F 1/1641 345/905 |
| 2011/0002038 A1 * | 1/2011 | Wang | ............ | H04N 13/388 359/479 |
| 2017/0214909 A1 * | 7/2017 | Subrahmanyam | ..... | G02B 30/50 |
| 2021/0117418 A1 * | 4/2021 | Dadwal | ............ | G06F 16/2465 |
| 2021/0318658 A1 * | 10/2021 | Shirakura | ............ | G09F 13/16 |
| 2023/0039906 A1 * | 2/2023 | Kasegawa | ............ | G02B 27/4205 |
| 2023/0213972 A1 * | 7/2023 | Lee | ............ | G06F 1/1616 361/679.01 |

* cited by examiner

DDA: DA11, DA12, DA21, DA22, DA31, DA32
DA: DA1, DA2, DA3
TDA: TDA1, TDA2, TDA3

DA: DA1, DA2, DA3, DDA
TDA: TDA1, TDA2, TDA3

NFA: NFA1, NFA2, NFA3, NFA4

DDA: DA11, DA12, DA21, DA22, DA31, DA32, DA41, DA42
DA: DA1, DA2, DA3, DA4, DDA
TDA: TDA1, TDA2, TDA3, TDA4

DISPLAY DEVICE

CROSS-REFERENCE TO RELATED APPLICATION

The present application claims priority to and the benefit of Korean Patent Application No. 10-2022-0169926 filed on Dec. 7, 2022, in the Korean Intellectual Property Office, the entire content of which is incorporated herein by reference.

BACKGROUND

1. Field

Aspects of some embodiments of the present disclosure relate to a display device.

2. Description of the Related Art

An electronic device such as a smart phone or a tablet PC may have a transparent display. The transparent display is a display that allows users to see the other surface (e.g., rear surface) through one surface (e.g., front surface) of the transparent display. That is, on the transparent display, an object positioned on the rear surface may be projected on the front surface.

In addition, the electronic device may have a foldable display device in which a screen may be folded into multiple portions. The foldable display device may be, for example, a flexible display device. The foldable display device provides flexibility to the display device by replacing a glass substrate surrounding a liquid crystal of an organic light emitting diode (OLED) with a plastic film.

The above information disclosed in this Background section is only for enhancement of understanding of the background and therefore the information discussed in this Background section does not necessarily constitute prior art.

SUMMARY

Aspects of some embodiments of the present disclosure include a display device capable of visually recognizing videos and images displayed on a display surface from the outside and displaying a 3D hologram image, when the display device is in-folded.

However, the characteristics of embodiments according to the present disclosure are not restricted to those set forth herein. The above and other aspects of some embodiments of the present disclosure will become more apparent to one of ordinary skill in the art to which the present disclosure pertains by referencing the detailed description of the present disclosure given below.

According to some embodiments of the present disclosure, a display device including a first non-folding area, a second non-folding area, a third non-folding area, and a fourth non-folding area, and that is in-folded based on folding lines between the first non-folding area, the second non-folding area, the third non-folding area, and the fourth non-folding area, the display device comprises a display panel including a light transmission display area in portion of the first to third non-folding areas, and a light blocking display area in the remaining areas of the first to third non-folding areas, a light transmission control layer in the light blocking display area, and a main processor configured to control the light transmission control layer and the display panel, wherein the main processor is configured to output a flat image in a first mode and display a hologram image in a second mode.

According to some embodiments, the display panel includes a pixel and a light transmitting portion, and the light transmitting portion has a light transmittance higher than that of the pixel and is in the light transmission display area.

According to some embodiments, the light transmission display area includes a plurality of pixels and at least one light transmitting portion.

According to some embodiments, the light blocking display area includes a plurality of pixels and at least one light transmitting portion.

According to some embodiments, the main processor displays an image in the light transmission display area and the light blocking display area in the first mode, and does not display an image in the light transmission display area and the light blocking display area in the second mode.

According to some embodiments, the display panel of the fourth non-folding area includes a display dedicated area including a plurality of pixels.

According to some embodiments, the main processor displays an image in the display dedicated area in the second mode.

According to some embodiments, the display dedicated area does not include a light transmitting portion having a light transmittance higher than that of the pixel.

According to some embodiments, the light transmission control layer is in the display dedicated area.

According to some embodiments, the display device further comprises a reflective module for displaying the hologram image in the second mode, wherein the reflective module includes a first reflective member adjacent to the first non-folding area, a second reflective member adjacent to the second non-folding area, a third reflective member adjacent to the third non-folding area, and the first to third reflective members are adjacent to the fourth non-folding area.

According to some embodiments of the present disclosure, a display device including a first non-folding area, a second non-folding area, a third non-folding area, and a fourth non-folding area, and that is in-folded based on folding lines between the first non-folding area, the second non-folding area, the third non-folding area, and the fourth non-folding area, the display device comprises a display panel including a light transmission display area in portion of the first to third non-folding areas, and a light blocking display area in the remaining areas of the first to third non-folding areas, and a light transmission control layer in the light blocking display area, wherein the display panel includes a pixel and a light transmitting portion, and the light transmitting portion has a light transmittance higher than that of the pixel and is in the light transmission display area.

According to some embodiments, the light transmission display area includes a plurality of pixels and at least one light transmitting portion.

According to some embodiments, the pixels and the light transmitting portion in the light transmission display area are alternately arranged and have the same area.

According to some embodiments, the light blocking display area includes a plurality of pixels and at least one light transmitting portion.

According to some embodiments, the pixels and the light transmitting portion in the light blocking display area are alternately arranged and have the same area.

According to some embodiments, the light transmission control layer includes a polymer dispersed liquid crystal layer.

According to some embodiments, the display panel of the fourth non-folding area includes a plurality of pixels, and includes a display dedicated area not including the light transmitting portion.

According to some embodiments, the display device further comprises a step compensation layer on the light transmission display area of the display panel, and a protective window on the step compensation layer.

According to some embodiments, a thickness of the light transmission control layer is equal to a sum of a thickness of the step compensation layer and a thickness of the protective window.

According to some embodiments, the step compensation layer and the protective window are further on the fourth non-folding region.

In a display device according to some embodiments, transmittance of light transmitting through a partial region of a display surface of the display device may be adjusted.

Further, in a display device according to some embodiments, when the display device is in-folded, videos and images displayed on the display surface may be visually recognized from the outside, and a 3D hologram image may be displayed.

However, the characteristics of embodiments according to the present disclosure are not restricted to those specifically described herein. The above and other characteristics of the embodiments will become more apparent to one of ordinary skill in the art to which the embodiments pertain by referencing the claims.

BRIEF DESCRIPTION OF THE DRAWINGS

The above and other aspects and features of the present disclosure will become more apparent by describing in more detail aspects of some embodiments thereof with reference to the attached drawings, in which.

DETAILED DESCRIPTION

Aspects of some embodiments of the present disclosure will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

Figure 1:
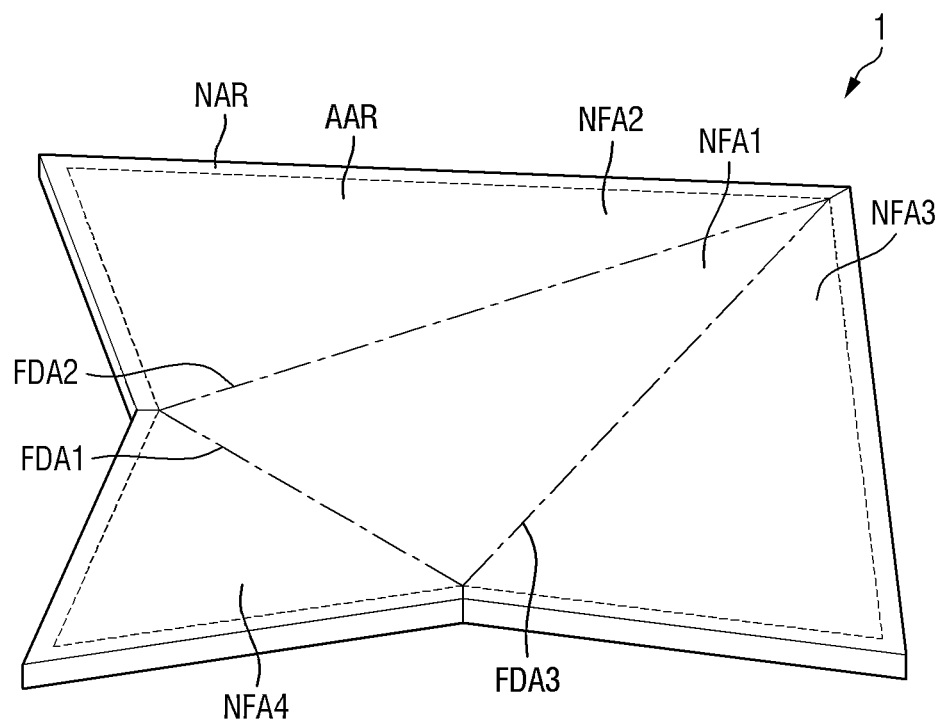
FIG. 1 is a perspective view of a display device according to some embodiments.
Figure 1:
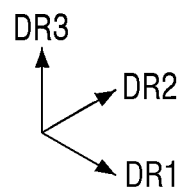
Figure 2:
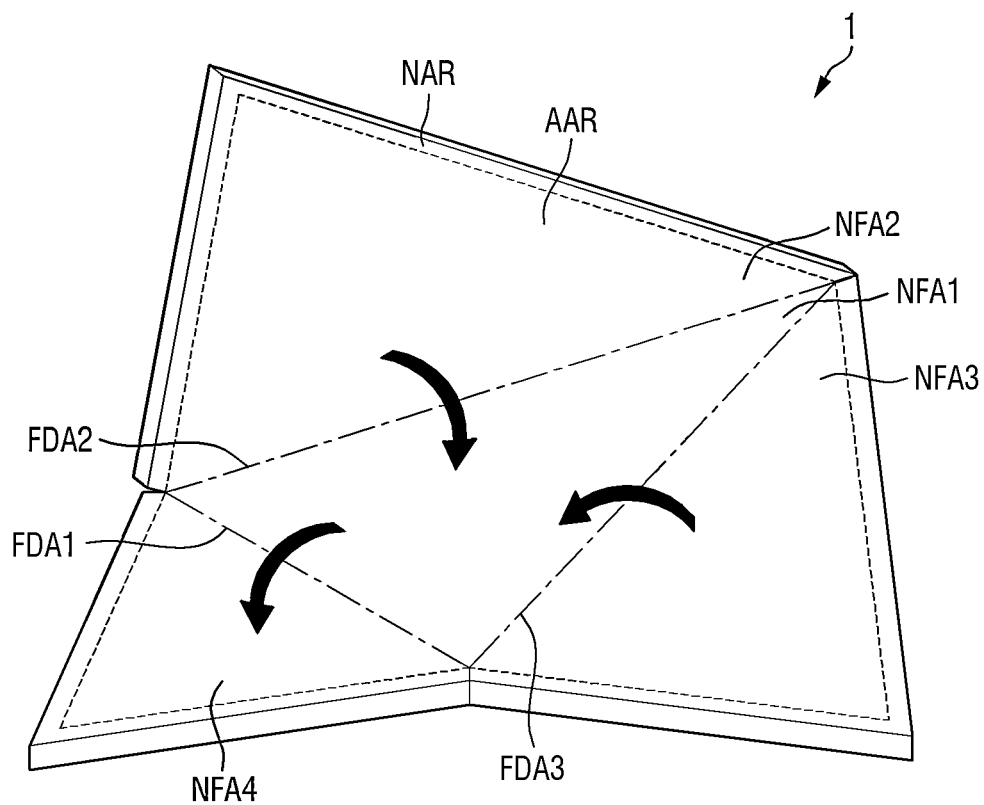
FIGS. 2 and 3 are perspective views illustrating a state in which the display device of FIG. 1 is in-folded according to some embodiments.
Figure 2:
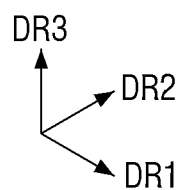
Figure 3:
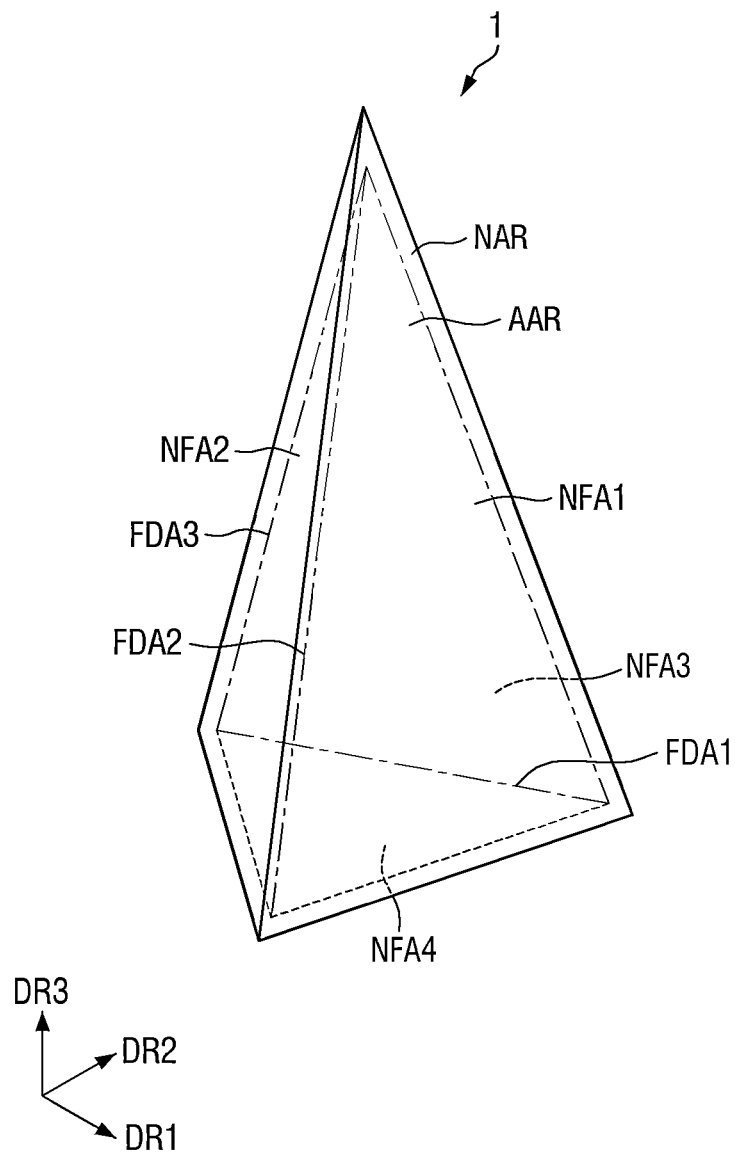

FIG. 1 is a perspective view of a display device according to some embodiments. FIGS. 2 and 3 are perspective views illustrating a state in which the display device of FIG. 1 is in-folded according to some embodiments.

In the drawings, a first direction DR1 represents a horizontal direction of a display device 1 in a plan view, and a second direction DR2 represents a vertical direction of the display device 1 in a plan view. In addition, a thickness direction (a third direction) represents a thickness direction of the display device 1. The first direction DR1 and the second direction DR2 perpendicularly intersect each other, and the thickness direction (a third direction) is a direction intersecting a plane on which the first and second directions DR1 and DR2 lie, and perpendicularly intersects both the first and second directions DR1 and DR2. However, it should be understood that the directions mentioned in the embodiments refer to relative directions, and the embodiments are not limited to the mentioned directions.

The display device 1 may display a screen or images at an active area AAR, which will be described later, and may include various devices including the active area AAR. Examples of display device 1 may include, but are not limited to, electronic devices having display capabilities such as, for example, smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle instrument boards, digital cameras, camcorders, external billboards, electric signs, various medical devices, various inspection devices, various home appliances such as refrigerators and washing machines including the active area AAR, and Internet of Things (IOT) devices.

The display device 1 may have a polygonal shape in a plan view (e.g., a view perpendicular or normal with respect to a plane that is parallel to the first and second directions DR1 and DR2). The display device 1 may have a plurality of triangular shapes with one side adjacent to each other in a plan view. When the display device 1 is in-folded as illustrated in FIGS. 2 and 3 to be described later, the display device 1 may have a developed view shape of a triangular pyramid to have a triangular pyramid shape. The display device 1 may include two short sides located in a horizontal direction (first direction DR1) and two long sides located in a vertical direction (second direction DR2).

The display device 1 includes an active area AAR and a non-active area NAR. The active area AAR of the display device 1 may include a display area. In addition, when the display device 1 has a touch function, a touch area, which is an area where a touch input is sensed, may also be included in the active area AAR.

A shape of the active area AAR may correspond to a shape of the display device 1 to which the active area AAR is applied. For example, when the display device 1 has a rectangular shape in a plan view, the shape of the active area AAR may also have a rectangular shape.

The active area AAR may include a plurality of pixels. The pixel is a basic unit for displaying a screen. The pixels may include, but are not limited to, a red pixel, a green pixel, and a blue pixel. The plurality of pixels may be alternately arranged in a plan view. For example, the pixels may be arranged in a matrix arrangement (e.g., in rows and columns), but embodiments according to the present disclosure are not limited thereto.

Figure 7:
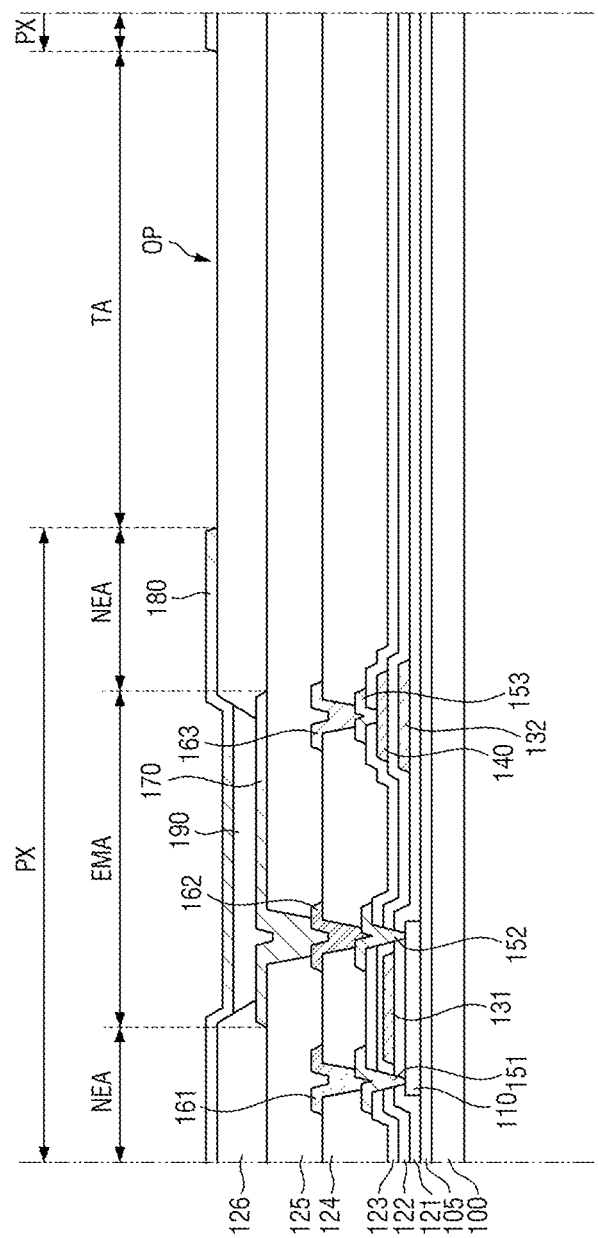
FIG. 7 is a cross-sectional view of a pixel and a light transmitting portion of a display panel according to some embodiments.

Each pixel may include an emitting material area (see 'EMA' in FIG. 7). The emitting material area may be defined as an area in which a light emitting material, for example, an organic light emitting layer is located. A size of the organic light emitting layer in a plan view may be smaller than a size of the pixel. An area in the pixel in which the light emitting material such as the organic light emitting layer is not located may be defined as a non-emitting material area ('NEA' in FIG. 7). Circuits or wirings for driving the pixels may be located in the non-emitting material area, but are not limited thereto.

The non-active area NAR may be arranged around the active area AAR. The non-active area NAR may include a non-display area in which no display is made. The non-active area NAR may surround all sides of the active area AAR (e.g., in a periphery or outside a footprint of the active area AAR), but is not limited thereto, and the non-active area NAR may not also be located near at least some of the sides of the active area AAR. A bezel area of the display device 1 may be configured as a non-active area NAR.

The display device 1 may be a foldable display device. In the present specification, the foldable display device refers to a display device capable of being folded (e.g., without damaging the foldable display device), which may have both a folded state and a non-folded state. In addition, folding may include, but is not limited to, folding the display device at an angle of about 180°, and it may be understood that the display device is folded even when the display device is bent at an angle greater than 180° or less than 180°, for example, when the display device is bent at an angle greater than or equal to 90° and less than 180° or greater than or equal to 120° and less than 180°. Furthermore, regarding the folding state, even if the display device is not completely folded, the display device may be referred to as the folding state when the display device is in a bent state out of the non-folding state. For example, even if the display device is bent at an angle of less than 90°, the display device may be expressed as being in the folding state in order to distinguish the display device from the non-folding state when a maximum folding angle is 90° or more. For example, like the display device 1 illustrated in FIGS. 2 and 3, the display device 1 may be folded to have a triangular pyramid shape.

The display device 1 may include a folding line FDA (or a folding area). The display device 1 may be folded based on the folding line FDA. The folding may be divided into in-folding in which the display surface of the display device 1 is folded to face inward, and out-folding in which the display surface of the display device 1 is folded to face outward. Although FIG. 2 illustrates a state in which the display device 1 is in-folded, the display device 1 is not limited thereto and may also be folded in an out-folding manner. In addition, the display device 1 may be folded using only one of an in-folding manner and an out-folding manner, and both in-folding and out-folding may also be performed in the display device 1. The display device in which both in-folding and out-folding are performed may also be in-folded and out-folded based on the same folding line FDA, and may also include a plurality of folding lines that perform different types of folding, such as an in-folding dedicated folding line to and an out-folding dedicated folding line. Accordingly, the folding line FDA may include a first folding line FDA1, a second folding line FDA2, and a third folding line FDA3 for in-folding the display device 1 into a triangular pyramid shape.

The display device 1 may include a non-folding area NFA located around the folding line FDA. The non-folding area NFA includes a fourth non-folding area NFA4 positioned on one side of the first folding line FDA1 and a first non-folding area NFA1 positioned on the other side of the first folding line FDA1. The non-folding area NFA includes the first non-folding area NFA1 positioned on one side of the second folding line FDA2 and a second non-folding area NFA2 positioned on the other side of the second folding line FDA2. The non-folding area NFA includes the first non-folding area NFA1 positioned on one side of the third folding line FDA3 and a third non-folding area NFA3 positioned on the other side of the third folding line FDA3.

Accordingly, the display device 1 may have a developed view shape of a triangular pyramid. In addition, when the display device 1 is in-folded along the folding line FDA, the display device 1 may have a triangular pyramid shape as in the embodiments illustrated and described with respect to FIG. 3. Therefore, the first to fourth non-folding areas NFA1 to NFA4 may have a triangular shape. For example, the first to third non-folding areas NFA1 to NFA3 may have the same shape and size as each other. In addition, a length of one side of the first non-folding area NFA1 and a length of one side of the second non-folding area NFA2 in contact with the first non-folding area NFA1 may be equal to each other. In addition, a length of one side of the first non-folding area NFA1 and a length of one side of the third non-folding area NFA3 in contact with the first non-folding area NFA1 may be equal to each other.

The active area AAR may include a light transmission display area TDA that transmits external light and a light blocking display area DA that blocks external light. For example, the active area AAR may be divided into the light transmission display area TDA and the light blocking display area DA depending on whether or not the active area AAR includes a light transmitting portion TA. According to some embodiments, the light transmission display area TDA may correspond to some of the first to third non-folding areas NFA1 to NFA3, and the light blocking display area DA may correspond to a portion of the active area AAR overlapping the second non-folding area NFA2, but the present disclosure is not limited thereto. This will be described in more detail later with reference to FIG. 4.

According to some embodiments, the display device 1 may be folded by folding all of the corresponding members because a display panel or layers, panels, and substrates stacked on the display panel themselves have flexible characteristics. In some embodiments, at least some of the display panel or members stacked on the display panel may have a shape separated based on the folding line FDA. In this case, the separated member positioned in the non-folding area NFA may also not have the flexible characteristics.

The active area AAR/non-active area NAR and the folding line FDA/non-folding area NFA of the display device 1 described above may overlap at the same position. For example, a specific position may be in the active area AAR and the first non-folding area NFA1 at the same time. Another specific location may be in the non-active area NAR and the first non-folding area NFA1 at the same time. Still another specific position may be in the active area AAR and an arrangement area of the folding line FDA at the same time.

According to some embodiments, the active area AAR of the display device 1 may be arranged across all of the first to fourth non-folding areas NFA1 to NFA4. Furthermore, the active area AAR may also be positioned in the folding line FDA corresponding to boundaries between the first to fourth non-folding areas NFA1 to NFA4. That is, the active area AAR of the display device 1 may be continuously arranged regardless of boundaries such as the non-folding area NFA and the folding line FDA. However, the present disclosure is not limited thereto, and the active area AAR may be positioned only in any one of the first to fourth non-folding areas NFA1 to NFA4, and the active area AAR is located in the first to fourth non-folding areas NFA1 to NFA4, but the active area AAR may not be located in the folding line FDA.

Figure 4:
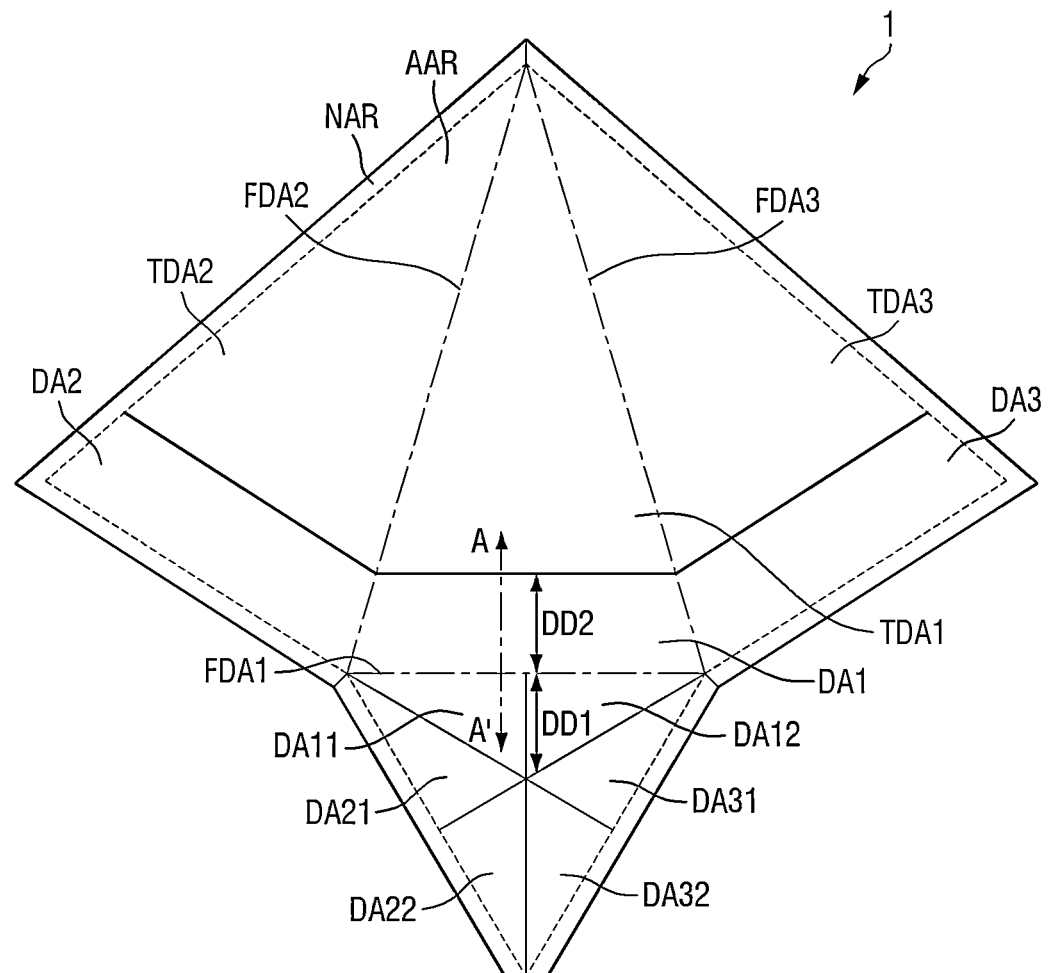
FIG. 4 is a plan view illustrating display areas of the display device according to some embodiments.

FIG. 4 is a plan view illustrating display areas of the display device according to some embodiments.

Referring to FIG. 4, the active area AAR may include a light transmission display area TDA that transmits external light, a light blocking display area DA that blocks external light, and a display dedicated area DDA. For example, the active area AAR may be divided into the light transmission display area TDA and the light blocking display area DA depending on whether or not the active area AAR includes a light transmitting portion TA.

The light transmission display area TDA and the light blocking display area DA are areas in which display is performed while transmitting light, and may include a plurality of light transmitting portions (see 'TA' in FIGS. 7 to 9) separated from each other. The light transmitting portion (see 'TA' in FIGS. 7 to 9) is an area that does not itself emit light, and is a portion that transmits light in a thickness direction. The light may include not only light of a visible ray wavelength, but also light of near infrared and/or infrared wavelengths. The light transmitted through the light transmitting portion (see 'TA' in FIGS. 7 to 9) may further include light of near ultraviolet and/or ultraviolet wavelengths.

The non-emitting material area of each pixel is also an area that does not emit light by itself, but the light transmitting portion (see 'TA' in FIGS. 7 to 9) has a light transmittance higher than that of the non-emitting material areas. Here, the light transmittance is a transmittance of light in a direction passing through each area, and refers to the transmittance of light traveling in the thickness direction. Therefore, the light transmission display area TDA including the light transmitting portion (see 'TA' in FIGS. 7 to 9) has a light transmittance higher than that of the light blocking display area DA that does not include the light transmitting portion (see 'TA' in FIGS. 7 to 9). The light transmission display area TDA may be utilized for various purposes. The method of utilizing the light transmission display area TDA is not limited thereto, but, for example, the light transmission display area TDA is utilized like a transparent display. In this case, no other components are located on a rear surface of the transmission display area TDA, and like a window, an object positioned on the rear surface may be confirmed through the light transmission display area TDA.

The light blocking display area DA includes a first light blocking display area DA1, a second light blocking display area DA2, and a third light blocking display area DA3. In addition, the light transmission display area TDA includes a first light transmission display area TDA1, a second light transmission display area TDA2, and a third light transmission display area TDA3.

A partial area of the first non-folding area NFA1 of the active area AAR may be the first light blocking display area DA1, and the remaining area of the first non-folding area NFA1 may be the first light transmission display area TDA1. In addition, a partial area of the second non-folding area NFA2 of the active area AAR may be the second light blocking display area DA2, and the remaining area of the second non-folding area NFA2 may be the second light transmission display area TDA2. In addition, a partial area of the third non-folding area NFA3 of the active area AAR may be the third light blocking display area DA3, and the remaining area of the third non-folding area NFA3 may be the third light transmission display area TDA3. In addition, the fourth non-folding area NFA4 of the active area AAR is a display dedicated area DDA and may be an area that does not include the light transmitting portion.

For example, the first light transmission display area TDA1 may be located adjacent to the first folding line FDA1 in the first non-folding area NFA1. In addition, the first light transmission display area TDA1 may have a second width DD2 in the first non-folding area NFA1. The first light transmission display area TDA1 may also be adjacent to the second folding line FDA2 and the third folding line FDA3.

In addition, the display dedicated area DDA includes an eleventh display dedicated area DA11, a twelfth display dedicated area DA12, a twenty-first display dedicated area DA21, a twenty-second display dedicated area DA22, a thirty-first display dedicated area DA31, and a thirty-second display dedicated area DA32. For example, the eleventh display dedicated area DA11 and the twelfth display dedicated area DA12 may be located adjacent to the first folding line FDA1. That is, when the display device 1 is in-folded as in the embodiments illustrated and described with respect to FIG. 3, the eleventh display dedicated area DA11 and the twelfth display dedicated area DA12 may be located adjacent to the first folding line FDA1. In addition, when the display device 1 is in-folded as in the embodiments illustrated and described with respect to FIG. 3, the twenty-first display dedicated area DA21 and the twenty-second display dedicated area DA22 may be located adjacent to the second folding line FDA2. In addition, the thirty-first display dedicated area DA31 and the thirty-second display dedicated area DA32 may be located adjacent to the third folding line FDA3. Each of the eleventh display dedicated area DA11, the twelfth display dedicated area DA12, the twenty-first display dedicated area DA21, the twenty-second display dedicated area DA22, the thirty-first display dedicated area DA31, and the thirty-second display dedicated area DA32 may have a first width DD1. Here, the first width DD1 may be a maximum height of each display dedicated area DDA.

Accordingly, in a 3D hologram mode, when the display device 1 is in-folded, the display device 1 may have a triangular pyramid shape. In this case, the light blocking display area DA may be an area through which external light does not transmit, and the light transmission display area TDA may be an area through which external light transmits. This will be described later with reference to FIG. 9.

Hereinafter, a cross-sectional structure of the above-described display device 1 will be described in more detail.

Figure 5:
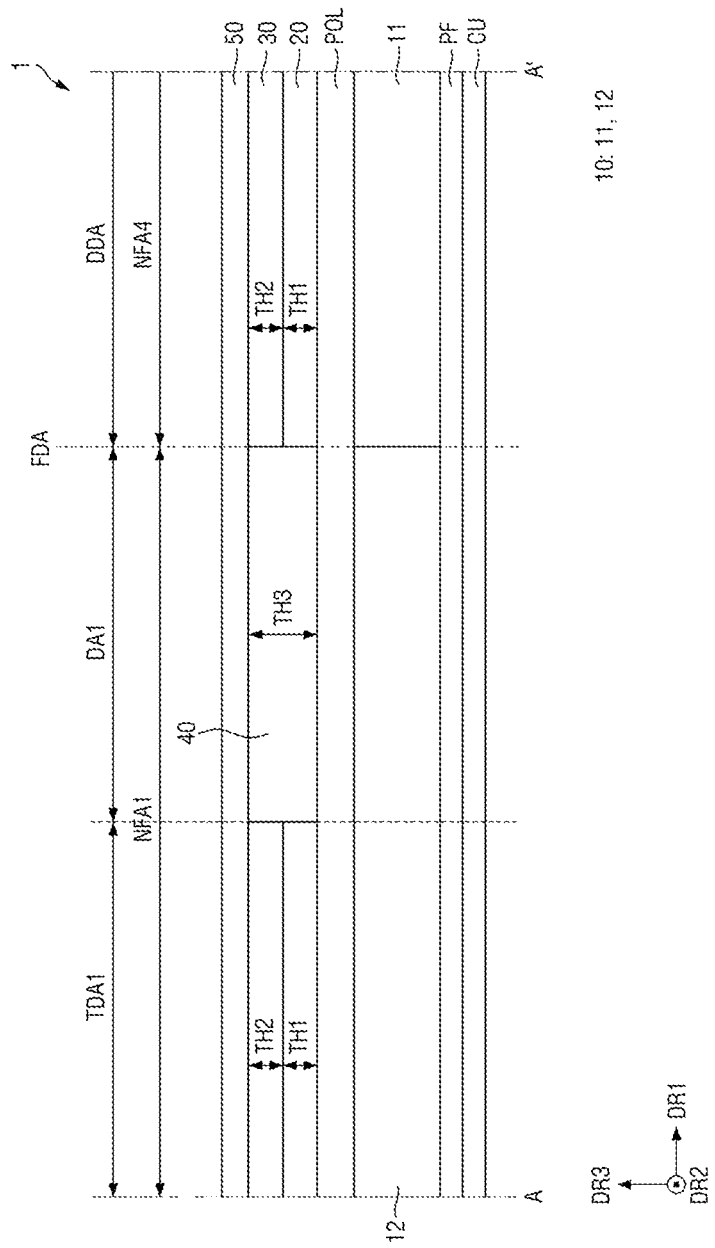
FIG. 5 is a cross-sectional view illustrating a state in which the display device is not folded according to some embodiments.
Figure 6:
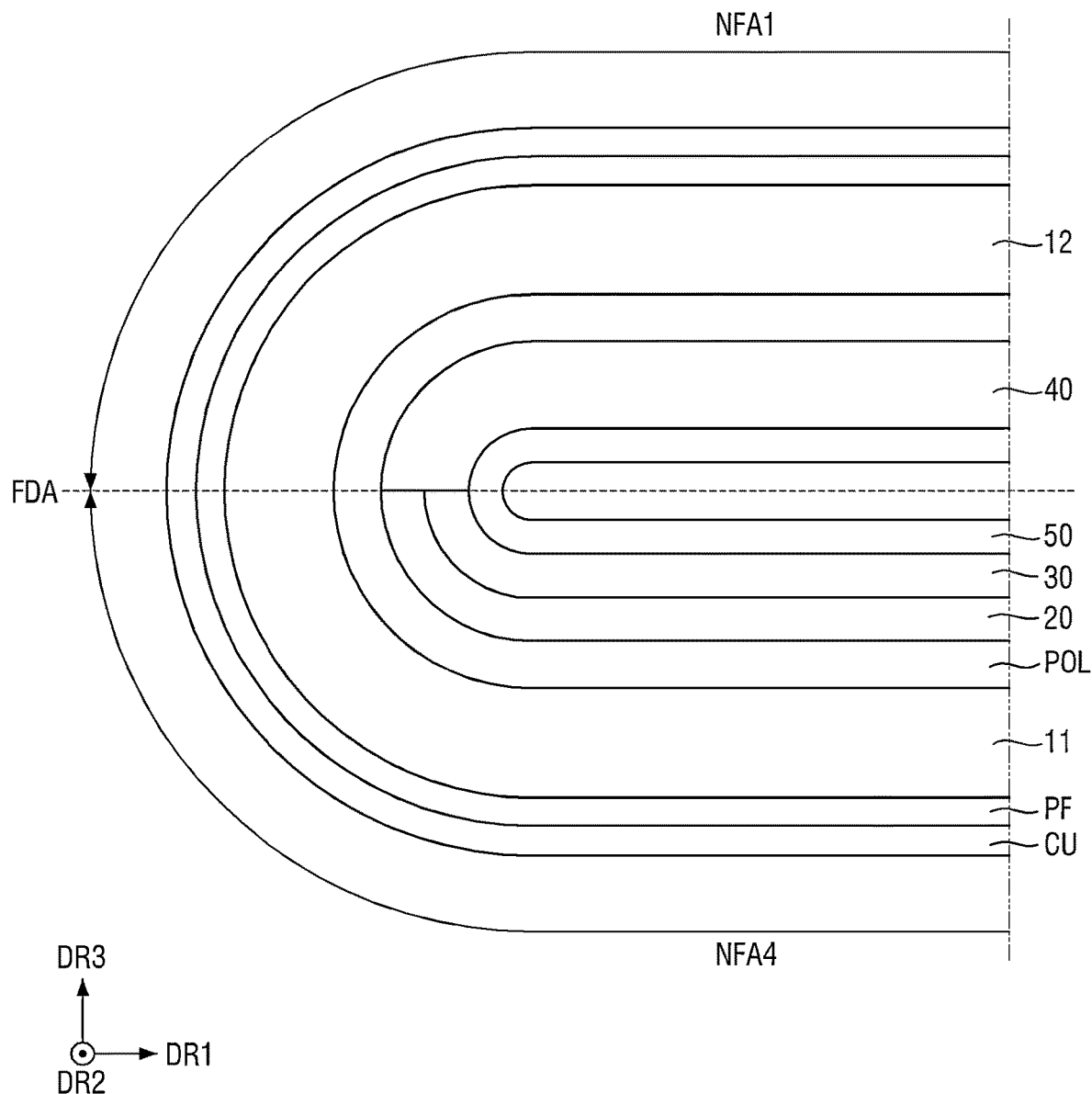
FIG. 6 is a cross-sectional view illustrating a state in which the display device is in-folded according to some embodiments.

FIG. 5 is a cross-sectional view illustrating a state in which the display device is not folded according to some embodiments. FIG. 6 is a cross-sectional view illustrating a state in which the display device is in-folded according to some embodiments.

Referring to FIGS. 5 and 6, the display device 1 may include a display panel, a polarization member POL, a step compensation layer 20 and a protective window 30 located in the display dedicated area DDA and the first light transmission display area TDA1, a light transmission control layer 40 located in the first light blocking display area DA1, and a protective film 50 which are sequentially stacked on one side of the display panel in the thickness direction (third direction DR3), and a polymer film layer PF and a cushion layer CU sequentially stacked on the other side of the display panel in the thickness direction (third direction DR3). At least one coupling member such as an adhesive layer or a pressure-sensitive adhesive layer may be located between the respective stacked members to couple the stacked members adjacent to each other. However, the present disclosure is not limited thereto, and other layers may also be further located between the respective layers, and some of the stacked members may also be omitted.

The display panel is a panel that displays a screen or image. Examples of the display panel may include a light-receiving display panel such as a liquid crystal display panel (LCD) and an electrophoretic display panel (EPD), as well as a self-light emitting display panel such as an organic light emitting display panel (OLED), an inorganic light emitting display panel (inorganic EL), a quantum dot light emitting display panel (QED), a micro LED display panel (micro-LED), a nano LED display panel (nano-LED), a plasma display panel (PDP), a field emission display panel (FED), and a cathode ray display panel (CRT).

Hereinafter, an organic light emitting display panel will be described as an example of the display panel, and unless a special distinction is required, an organic light emitting display panel applied to some embodiments will be simply abbreviated as a display panel. However, the embodiments are not limited to the organic light emitting display panel, and other display panels listed above or known in the present technical field may be applied within the spirit and scope of embodiments according to the present disclosure.

The display panel may include a display dedicated layer 11 located in the fourth non-folding area NFA4 and a display light transmission layer 12 located in the first non-folding area NFA1. That is, the display panel may include the display dedicated layer 11 and the display light transmission layer 12 located in the fourth non-folding area NFA4. The display dedicated layer 11 may include only a pixel PX, and the display light transmission layer 12 may include a pixel PX and a light transmitting portion (see 'TA' of FIGS. 7 to 9). The display dedicated layer 11 and the display light transmission layer 12 are separate structures, and may be spaced apart from each other near the folding line FDA, but are not limited thereto. For example, the display dedicated layer 11 and the display light transmission layer 12 may also be integrally formed.

Hereinafter, further details of an example structure of the display panel will be described with reference to FIGS. 7 to 9.

FIG. 7 is a cross-sectional view of a pixel and a light transmitting portion of a display panel according to some embodiments.

First, a cross-sectional structure of the pixel PX will be described in more detail with reference to FIG. 7. The display panel may include a substrate 100, a buffer layer 105, a semiconductor layer 110, a first insulating layer 121, a first conductive layer 130, a second insulating layer 122, a second conductive layer 140, a third Insulating layer 123, a third conductive layer 150, a fourth insulating layer 124, a fourth conductive layer 160, a fifth insulating layer 125, a fifth conductive layer 170, a pixel defining film 126 including an opening exposing the fifth conductive layer 170, an organic layer 190 located in the opening of the pixel defining film 126, and a sixth conductive layer 180 located on the organic layer 190 and the pixel defining film 126. Each of the above-described layers may be formed as a single film, but may also be formed as a stacked film including a plurality of films. Another layer may also be further located between the respective layers.

The substrate 100 supports the respective layers located thereon. The substrate 100 may be made of an insulating material such as a polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 100 may be a flexible substrate that may be bent, folded, and rolled. A material constituting the flexible substrate may be, for example, polyimide (PI), but is not limited thereto.

A buffer layer 105 is located on the substrate 100. The buffer layer 105 may prevent diffusion of impurity ions, prevent permeation of moisture or outside air, and perform a surface planarization function. The buffer layer 105 may include silicon nitride, silicon oxide, or silicon oxynitride. The buffer layer 105 may also be omitted depending on the type of substrate 100 or process conditions.

A semiconductor layer 110 is located on the buffer layer 105. The semiconductor layer 110 forms a channel of a thin film transistor of the pixel PX. The semiconductor layer 110 may include polycrystalline silicon. However, embodiments according to the present disclosure are not limited thereto, and the semiconductor layer 110 may also include single crystal silicon, low temperature polycrystalline silicon, amorphous silicon, or an oxide semiconductor. The oxide semiconductor may include a binary compound (ABx), a ternary compound (ABxCy), and a quaternary compound (ABxCyDz) containing, for example, indium, zinc, gallium, tin, titanium, aluminum, hafnium (Hf), zirconium (Zr), magnesium (Mg), and the like.

A first insulating layer 121 may be a gate insulating film having a gate insulating function. The first insulating layer 121 may include a silicon compound, a metal oxide, or the like. For example, the first insulating layer 121 may include silicon oxide, silicon nitride, silicon oxynitride, aluminum oxide, tantalum oxide, hafnium oxide, zirconium oxide, titanium oxide, or the like. These oxides may be used alone or in combination with each other. The first insulating layer 121 may be a single film or a multilayer film including stacked films of different materials.

The first insulating layer 121 is located on the semiconductor layer 110, and may be generally arranged across an entire surface of the substrate 100.

A first conductive layer 130 is located on the first insulating layer 121. The first conductive layer 130 may be a gate conductive layer. The first conductive layer 130 may include a gate electrode 131 of the thin film transistor of the pixel, a scan line connected to the gate electrode 131, and a first electrode 132 of a storage capacitor.

The first conductive layer 130 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 130 may be a single film or a multilayer film.

A second insulating layer 122 may be located on the first conductive layer 130. The second insulating layer 122 may be an interlayer insulating film. The second insulating layer 122 may include an inorganic insulating material such as silicon oxide, silicon nitride, silicon oxynitride, hafnium oxide, aluminum oxide, titanium oxide, tantalum oxide, or zinc oxide.

A second conductive layer 140 is located on the second insulating layer 122. The second conductive layer 140 may be a second gate conductive layer. The second conductive layer 140 may include a second electrode of the storage capacitor. The second conductive layer 140 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 140 may be made of the same material as the first conductive layer 130, but is not limited thereto. The second conductive layer 140 may be a single film or a multilayer film.

A third insulating layer 123 is located on the second conductive layer 140. The third insulating layer 123 may be an interlayer insulating film. The third insulating layer 123 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB). The third insulating layer 123 may be a single film or a multilayer film including stacked films of different materials.

A third conductive layer 150 is located on the third insulating layer 123. The third conductive layer 150 may be a first source/drain conductive layer. The third conductive layer 150 may include a first electrode 151 and a second electrode 152 of the thin film transistor of the pixel PX. The first electrode 151 and the second electrode 152 of the thin film transistor may be electrically connected to a source region and a drain region of the semiconductor layer 110 through contact holes penetrating through the third insulating layer 123, the second insulating layer 122, and the first insulating layer 121. A first power voltage electrode 153 of the pixel PX may also be formed of the third conductive layer 150.

The third conductive layer 150 may include one or more metals selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single film or a multilayer film. For example, the third conductive layer 150 may be formed in a stacked structure of Ti/Al/Ti, Mo/Al/Mo, Mo/AlGe/Mo, Ti/Cu, or the like.

A fourth insulating layer 124 is located on the third conductive layer 150. The fourth insulating layer 124 covers the third conductive layer 150. The fourth insulating layer 124 may be a via layer. The fourth insulating layer 124 may include an organic insulating material such as a polyacrylates resin, an epoxy resin, a phenolic resin, a polyamides resin, a polyimides resin, an unsaturated polyesters resin, a poly phenyleneethers resin, a polyphenylenesulfides resin, or benzocyclobutene (BCB).

A fourth conductive layer 160 is located on the fourth insulating layer 124. The fourth conductive layer 160 may be a second source/drain conductive layer. The fourth conductive layer 160 may include a data line of the pixel PX, a connection electrode 162, and first power voltage lines 161 and 163. The first power voltage line 161 may be electrically connected to the first electrode 151 of the thin film transistor of the pixel PX through a contact hole penetrating through the fourth insulating layer 124. The connection electrode 162 may be electrically connected to the second electrode 152 of the thin film transistor of the pixel PX through the contact hole penetrating through the fourth insulating layer 124. The first power voltage line 163 may also be electrically connected to the first power voltage electrode 153 through the contact hole penetrating through the fourth insulating layer 124.

The fourth conductive layer 160 may include one or more metals selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single film or a multilayer film. The fourth conductive layer 160 may be made of the same material as the third conductive layer 150, but is not limited thereto.

A fifth insulating layer 125 is located on the fourth conductive layer 160. The fifth insulating layer 125 covers the fourth conductive layer 160. The fifth insulating layer 125 may be a via layer. The fifth insulating layer 125 may include the same material as the above-described fourth insulating layer 124, or may include one or more materials selected from the materials described as the constituent materials of the fourth insulating layer 124.

A fifth conductive layer 170 is located on the fifth insulating layer 125. An anode electrode, which is a pixel electrode, may be formed of the fifth conductive layer 170. The anode electrode may be electrically connected to the connection electrode 162 made of the fourth conductive layer 160 through a contact hole penetrating through the fifth insulating layer 125, and may be connected to the second electrode 152 of the thin film transistor through the connection electrode 162. The anode electrode may at least partially overlap the emitting material area EMA of the pixel PX.

The fifth conductive layer 170 may have a stacked film structure in which a material layer having a high work function, made of indium-tin-oxide (ITO), indium-zinc-oxide (IZO), zinc oxide (ZnO), or indium oxide ($In_2O_3$) and a reflective material layer made of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof are stacked, but is not limited thereto. The layer having the high work function may be located on a layer above the reflective material layer and located close to the organic layer 190. The fifth conductive layer 170 may have a multilayer structure of ITO/Mg, ITO/MgF, ITO/Ag, and ITO/Ag/ITO, but is not limited thereto.

A pixel defining film 126 may be located on the fifth conductive layer 170. The pixel defining film 126 may at least partially overlap the non-emitting material area NEA of the pixel PX. The pixel defining film 126 may include an opening exposing the fifth conductive layer 170. The pixel defining film 126 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB). The pixel defining film 126 may be a single film or a multilayer film including stacked films of different materials.

An organic layer 190 is located in the opening of the pixel defining film 126. The organic layer 190 may include an organic light emitting layer, a hole injection/transport layer, and an electron injection/transport layer. The organic layer 190 may overlap the emitting material area EMA.

A sixth conductive layer 180 is located on the organic layer 190 and the pixel defining film 126. A cathode electrode, which is a common electrode, may be formed of the sixth conductive layer 180. The cathode electrode may also be located not only in the emitting material area EMA of the pixel PX but also in the non-emitting material area NEA thereof. That is, the cathode electrode may be located on an entire surface of each pixel PX. The sixth conductive layer 180 may include a material layer having a small work function, such as Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). The sixth conductive layer 180 may further include a transparent metal oxide layer located on the material layer having the small work function.

According to some embodiments, an encapsulation film may be located on the sixth conductive layer 180. The encapsulation film may include an inorganic film. According to some embodiments, the encapsulation layer may include a first inorganic film, an organic film on the first inorganic film, and a second inorganic film on the organic film.

Next, a cross-sectional structure of the light transmitting portion TA will be described. The light transmitting portion TA has a structure in which some layers of the stacked structure of the pixels PX are removed. Because the light transmitting portion TA is an area that does not emit light, layers corresponding to the anode electrode, the organic light emitting layer, and the cathode electrode may be omitted. Due to the omission of the layers, the light transmitting portion TA may have a transmittance higher than that of the pixel PX.

For example, the sixth conductive layer 180, which is the cathode electrode, is not located in the light transmitting portion TA. The cathode electrode is a common electrode, and in the case of the pixel PX, the sixth conductive layer 180 is arranged across the entire area of the pixel PX, but the cathode electrode is removed from the light transmitting portion TA to form a light transmitting opening OP. The light transmitting opening OP may be defined by the sixth conductive layer 180. In a top emission type panel, the cathode electrode transmits light to some extent, but also reflects or absorbs a considerable amount of light. Because the sixth conductive layer 180, which is the cathode electrode, is not located in the light transmitting portion TA, the transmittance higher than that of the non-emitting material area NEA of the pixel PX may be secured.

In addition, the fifth conductive layer 170, which is the anode electrode, may not be located in the light transmitting portion TA. In the top emission type panel, the anode electrode includes the reflective material layer as described above. As the fifth conductive layer 170 itself is not located in the light transmitting portion TA, light may be transmitted in the thickness direction. In addition, as the organic layer 190 is not located in the light transmitting portion TA, a higher transmittance may be maintained. Furthermore, a semiconductor layer or other conductive layers may not be located in the light transmitting portion TA.

Figure 8:
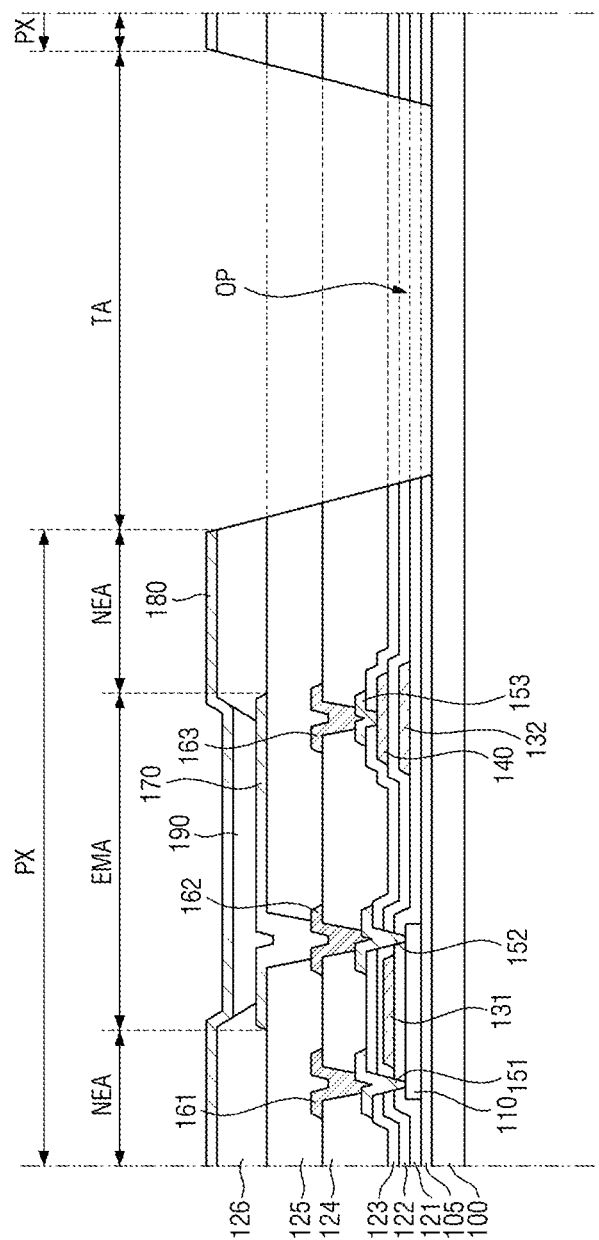
FIG. 8 is a cross-sectional view of a pixel and a light transmitting portion of a display panel according to some embodiments.

FIG. 8 is a cross-sectional view of a pixel and a light transmitting portion of a display panel according to some embodiments. FIG. 8 illustrates that insulating layers of the light transmitting portion TA may be further omitted from the structure of FIG. 7.

Referring to FIG. 8, as illustrated by a solid line in FIG. 6, in the light transmitting portion TA, the pixel defining film 126, the fifth insulating layer 125, the fourth insulating layer 124, the third insulating layer 123, the second insulating layer 122, the first insulating layer 121, and the buffer layer 105 may be all removed, and a surface of the substrate 100 may be exposed. The light transmitting opening OP may be defined by the sixth conductive layer 180, the pixel defining film 126, the fifth insulating layer 125, the fourth insulating layer 124, the third insulating layer 123, the second insulating layer 122, the first insulating layer 121, and the buffer layer 105. The substrate 100 may still not be removed even in the light transmitting portion TA. That is, the substrate 100 may overlap the light transmitting portion TA and may not include a through hole in the light transmitting portion TA. In the case of the embodiments illustrated and described with respect to FIG. 6, because many insulating layers are additionally removed as described above, a transmittance of the light transmitting portion TA may be further improved compared to the embodiments illustrated and described with respect to FIG. 5.

As another example, as illustrated by a dotted line in FIG. 8, in the light transmitting portion TA, some of the pixel defining film 126, the fifth insulating layer 125, the fourth insulating layer 124, the third insulating layer 123, the second insulating layer 122, the first insulating layer 121, and the buffer layer 105 may also be removed. For example, the present disclosure is not limited thereto, but all layers positioned above the fourth insulating layer 124 corresponding to the via layer may be removed to form the light transmitting opening OP.

Figure 9:
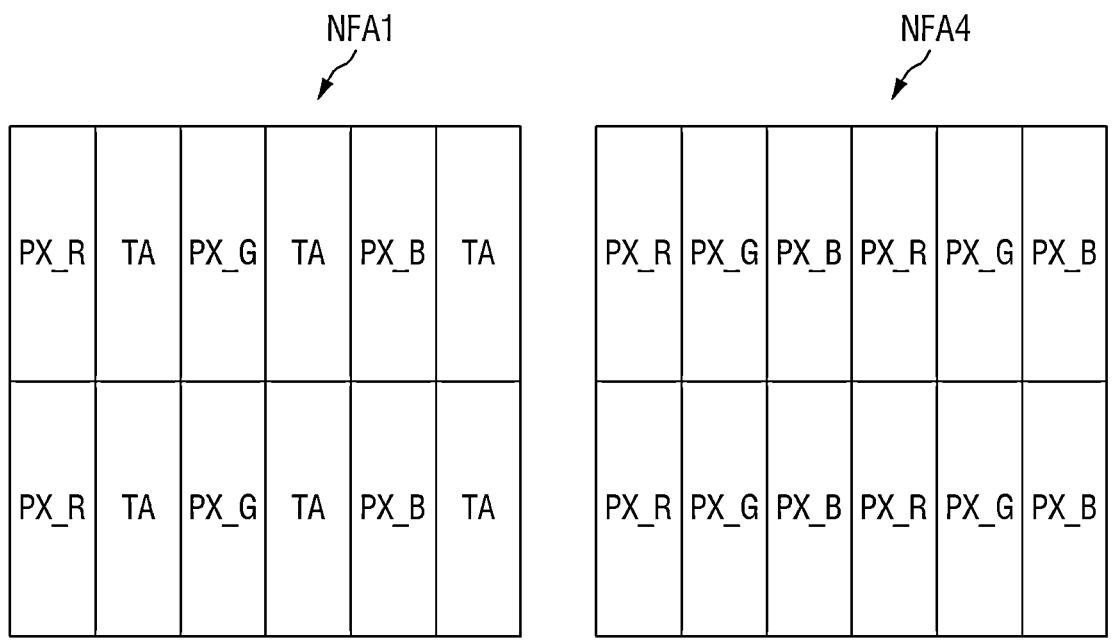
FIG. 9 is a schematic view illustrating an arrangement of pixels and light transmitting portions for each area of the display panel according to some embodiments.
Figure 9:
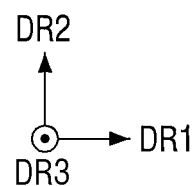

FIG. 9 is a schematic view illustrating an arrangement of pixels and light transmitting portions for each area of the display panel according to some embodiments.

Referring to FIG. 9, according to some embodiments, the first non-folding area NFA1 and the fourth non-folding area NFA4 include a red pixel PX_R, a green pixel PX_G, and a blue pixel PX_B, respectively. According to some embodiments, a size of the pixel PX for each color is the same, and the sizes of the pixel PX of the first non-folding area NFA1 and the pixel PX of the fourth non-folding area NFA4 are also the same. The first non-folding area NFA1 further includes a light transmitting portion TA in addition to the pixel PX. A size of the light transmitting portion TA is the same as that of the pixel PX, but is not limited thereto. According to some embodiments, the fourth non-folding area NFA4 may be a display dedicated area DDA. In addition, the first non-folding area NFA1 may include a first light blocking display area DA1 and a first light transmission display area TDA1.

In the fourth non-folding area NFA4, pixels PX of the same color are arranged in the second direction DR2, and pixels PX of different colors are alternately arranged in the first direction DR1. For example, in the fourth non-folding area NFA4, a red pixel PX_R, a green pixel PX_G, a blue pixel PX_B, a red pixel PX_R, a green pixel PX_G, and a blue pixel PX_B are arranged in this order along the first direction DR1.

In the first non-folding area NFA1, the pixels PX and the light transmitting portions TA are alternately arranged in the first direction DR1. Pixels PX of different colors are arranged along the first direction DR1. For example, in the first non-folding area NFA1, a red pixel PX_R, a light transmitting portion TA, a green pixel PX_G, a light transmitting portion TA, a blue pixel PX_B, and a light transmitting portion TA are arranged in this order along the first direction DR1. In the second direction DR2, pixels PX of the same color are arranged or light transmitting portions TA are arranged. In the first non-folding area NFA1, the number of pixels PX and the number of light transmitting portions TA may be the same. In addition, in the first non-folding area NFA1, an area of the pixel PX and an area of the light transmitting portion TA may be the same. That is, a ratio of the area of the light transmitting portion TA to the total area of the first non-folding area NFA1 may be 50%.

When the pixels PX and the light transmitting portions TA are alternately arranged in the first non-folding area NFA1 (in other words, when the light transmitting portions TA are each located between the pixels PX), a presence of the light transmitting portion TA may not be visually recognized well compared to a case in which the light transmitting portion TA having a large area is formed without an intervention of the pixel PX. At the same time, the first non-folding area NFA1 may be used as the transparent display by transmitting light through the light transmitting portion TA as described above.

Meanwhile, in the case of the embodiments illustrated and described with respect to FIG. 9, the number of pixels PX and the number of light transmitting portions TA are the same in the first non-folding area NFA1. When it is assumed that the sizes of the pixels PX and the light transmitting portions TA in the fourth non-folding area NFA4 and the first non-folding area NFA1 are the same, the number of pixels PX in the first non-folding area NFA1 is half of the number of pixels PX in the fourth non-folding area NFA4. That is, the number of pixels PX of the first non-folding area NFA1 per unit area is half of the number of pixels PX of the fourth non-folding area NFA4 per unit area, so that the first non-folding area NFA1 has a half resolution. As a result, the display panel may be divided into a high resolution area with a relatively high resolution and a low resolution area with a relatively low resolution. When the high resolution area and the low resolution area are scattered within the display panel, the user may recognize the corresponding areas in some cases, which causes deterioration in an image quality, but it is possible to lower the possibility that a user recognizes the corresponding areas by adjusting an arrangement of areas and display contents for each area.

Referring back to FIGS. 5 and 6, the polarization member POL may be located above the display panel. The polarization member POL polarizes light passing therethrough. The polarization member POL may serve to reduce reflection of external light.

A step compensation layer 20 and a protective window 30 may be located in the first light transmission display area TDA1 of the fourth non-folding area NFA4 and the first non-folding area NFA1 on the polarization member POL. That is, the step compensation layer 20 and the protective window 30 may be located in the display dedicated area DDA and the first light transmission display area TDA1. In the drawings, the protective window 30 is illustrated as being located on the step compensation layer 20, but is not limited thereto, and the step compensation layer 20 may also be located on the protective window 30. A light transmission control layer 40 may be located in the first light blocking display area DA1 of the first non-folding area NFA1 on the polarization member POL.

The light transmission control layer 40 may be located on the same layer (e.g., the polarization member POL) as the step compensation layer 20, but is not limited thereto. When the step compensation layer 20 is located on the protective window 30, the light transmission control layer 40 may also be located on the same layer as the protective window 30. That is, the light transmission control layer 40 may be located outside the step compensation layer 20 and/or the protective window 30.

The step compensation layer 20 may be made of a transparent material. The step compensation layer 20 may be in the form of a film cured after applying a resin, or may be transparent glass or plastic. However, the material constituting the step compensation layer 20 is not limited thereto, and the step compensation layer 20 may be a coupling layer located between the polarization member POL and the protective window 30. In this case, a thickness of the coupling layer located between the polarization member POL and the protective window 30 may be greater than a thickness of the coupling layer located between the polarization member POL and the light transmission control layer 40.

The step compensation layer 20 compensates for a difference between the thickness of the protective window 30 located in the fourth non-folding area NFA4 and the thickness of the light transmission control layer 40 located in the first light blocking display area DA1. For example, the thickness of the light transmission control layer 40 may be greater than the thickness of the protective window 30. As the step compensation layer 20 is located on the protective window 30, the step compensation layer 20 may compensate for the difference in thickness. That is, a sum of a thickness TH1 of the step compensation layer 20 and a thickness TH2 of the protective window 30 may be substantially equal to a thickness TH3 of the light transmission control layer 40.

A top surface of the light transmission control layer 40 may be at the same height as a top surface of the protective window 30 and may be substantially on the same plane or on an extension surface of the top surface of the protective window 30. Accordingly, a step that may occur between the display dedicated area DDA and the first light blocking display area DA1 of the display device 1 and between the first light transmission display area TDA1 and the first light blocking display area DA1 thereof may be compensated for, and the user may recognize that the active area AAR of the display device 1 is generally flat. That is, the screen displayed on the display device 1 recognized by the user may be generally natural without curves.

The protective window 30 may be made of a transparent material. The protective window 30 may be made of, for example, glass or plastic. When the protective window 30 includes glass, the glass may be ultra thin glass (UTG) or thin glass. When the protective window 30 includes plastic, the plastic may be transparent polyimide or the like, but is not limited thereto.

The light transmission control layer 40 may control a transmittance of light incident from the outside of the light transmission control layer 40. The transmittance of light transmitted through the light transmission control layer 40 is not limited thereto, but may be, for example, 0% to 96%. That is, the transmittance of light transmitted through the light transmission control layer 40 may vary within a range of 0% to 96%. In addition, the light transmission control layer 40 may have a thickness of 0.3 µm to 0.5 µm in the third direction DR3. However, the thickness of the light transmission control layer 40 is not limited thereto, and the light transmission control layer 40 may also have a thickness of 0.1 µm to 0.7 µm.

The first light blocking display area DA1 is described in the embodiments of FIGS. 5 to 9, but because the second light blocking display area DA2 and the third light blocking display area DA3 are substantially the same as the first light blocking display area DA1, descriptions thereof will be omitted. In addition, the first light transmission display area TDA1 is described in the embodiments of FIGS. 5 to 9, but because the second light transmission display area TDA2 and the third light transmission display area TDA3 are substantially the same as the first light transmission display area TDA1, descriptions thereof will be omitted.

As the light transmission control layer 40 is located on the display panel, that is, on a path of light emitted from the display panel, the transmittance of the light transmission control layer 40 may be adjusted even without adjusting an on/off of the display panel, so that videos and images may not be displayed in all or portion of the light blocking display area DA of the display device 1. That is, when the user does not want the videos and images displayed on the display device 1 to be visually recognized by others, the user may prevent the videos and images in the light blocking display area DA from being visually recognized or make the videos and images in the light blocking display area DA not be clearly recognized, by adjusting the transmittance of the light transmission control layer 40. The light transmission control layer 40 will be described later with reference to FIGS. 10 to 12.

A protective film 50 may be located on the protective window 30 and the light transmission control layer 40. The protective film 50 may perform at least one function of scattering prevention, shock absorption, engraving prevention, fingerprint prevention, and glare prevention of the protective window 30 and the light transmission control layer 40. The protective film 50 may also be omitted according to some embodiments.

A polymer film layer PF may be located on a lower side of the display panel. The polymer film layer PF may include, for example, polyimide (PI), polyethylene terephthalate (PET), polycarbonate (PC), polyethylene (PE), polypropylene (PP), polysulfone (PSF), polymethyl meta acrylate (PMMA), triacetyl cellulose (TAC), cycloolefin polymer (COP), and the like.

A cushion layer CU may be located on a lower side of the polymer film layer PF. The cushion layer CU may serve to increase durability against impact that may be applied in the thickness direction (third direction DR3) of the display device 1, and reduce a drop impact when the display device 1 is dropped. The cushion layer CU may include polyurethane or the like.

According to some embodiments, a metal plate may be further located on a lower side of the cushion layer CU or the polymer film layer PF. The metal plate may include, for example, a metal having excellent thermal conductivity, such as copper or silver.

In order to smoothly fold the display device 1, some layers of the display device 1 may be separated based on the folding line FDA. For example, the protective window 30 and the light transmission control layer 40 located on the upper side of the display panel may be separated based on the folding line FDA. In this case, in the non-folding state, the protective window 30 and the light transmission control layer 40 may be spaced apart from each other. In the non-folding state, the protective window 30 and the light transmission control layer 40 may each non-overlap the folding line FDA, but are not limited thereto.

The display dedicated layer 11 and the display light transmission layer 12 may also be separated based on the folding line FDA, but when the display dedicated layer 11 and the display light transmission layer 12 have sufficient flexibility, the display dedicated layer 11 and the display light transmission layer 12 may be integrally connected regardless of the folding line FDA and the non-folding area NFA.

When the display device 1 is in-folded based on the folding line FDA, the fourth non-folding area NFA4 may overlap the first non-folding area NFA1 in the thickness direction as illustrated in FIG. 6. The polymer film layer PF, the cushion layer CU, the polarization member POL, the protective film 50, and the like which are connected regardless of the folding line FDA may be bent to form a curved cross section along a width direction of the folding line FDA.

As the display device 1 is in-folded based on the folding line FDA, portions of the display dedicated layer 11 and the display light transmission layer 12 adjacent to the folding line FDA may each be bent to form a curved cross section along the width direction in areas adjacent to the folding line FDA. In addition, portions of the protective window 30 and the light transmission control layer 40 adjacent to the folding line FDA may each be bent to form a curved cross section along the width direction in the areas adjacent to the folding line FDA. However, embodiments according to the present disclosure are not limited thereto, and at least a portion of the display dedicated layer 11, the display light transmission layer 12, the protective window 30, and the light transmission control layer 40 may not be bent despite the display device 1 is in-folded based on the folding line FDA.

Hereinafter, the light transmission control layer 40 will be described in more detail with reference to FIGS. 10 to 12.

Figure 10:
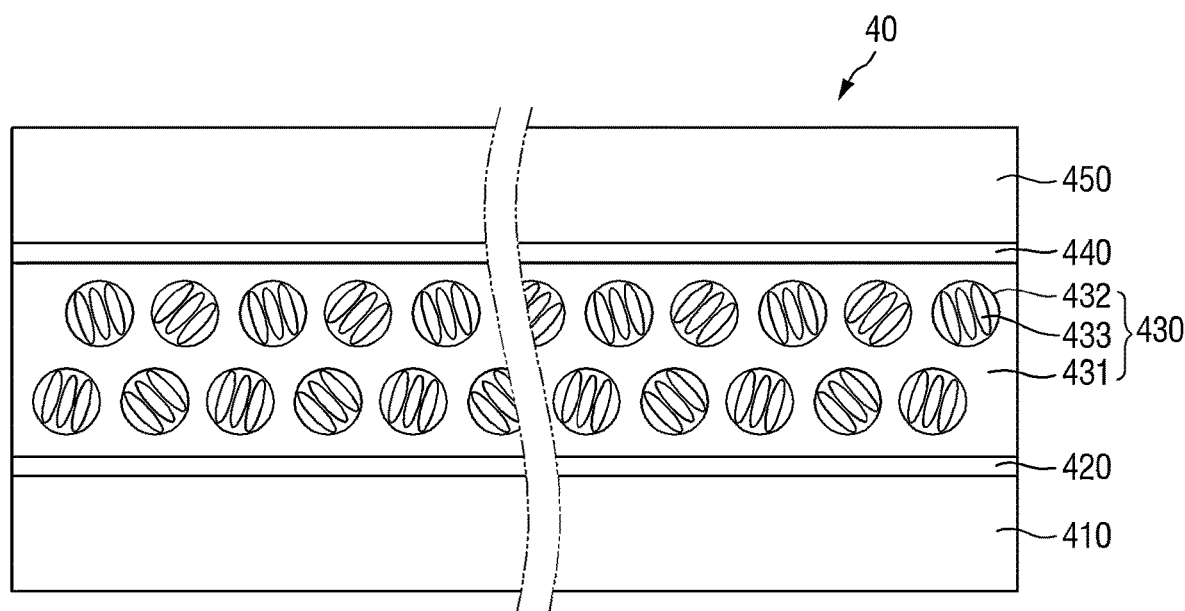
FIG. 10 is a cross-sectional view of a light transmission control layer according to some embodiments.

FIG. 10 is a cross-sectional view of a light transmission control layer according to some embodiments. FIGS. 11 and 12 are views illustrating a light path of the light transmission control layer of the display device according to some embodiments.

Referring to FIG. 10, the light transmission control layer 40 located in the first light blocking display area DA1 includes a first liquid crystal layer substrate 410, a first liquid crystal layer electrode 420, a liquid crystal layer 430, a second liquid crystal layer electrode 440, and a second liquid crystal layer substrate 450.

The first liquid crystal layer substrate 410 and the second liquid crystal layer substrate 450 may be transparent glass substrates or plastic films. For example, the first liquid crystal layer substrate 410 and the second liquid crystal layer substrate 450 may be sheets or films including a cellulose resin such as triacetyl cellulose (TAC) or diacetyl cellulose (DAC), a cyclic olefin polymer (COP) such as norbornene derivatives, an acrylic resin such as cyclic olefin copolymer (COC) and poly (methylmethacrylate) (PMMA), polyolefin such as polycarbonate (PC), polyethylene (PE), or polypropylene (PP), polyester such as polyvinyl alcohol (PVA), poly ether sulfone (PES), polyetheretherketone (PEEK), polyetherimide (PEI), polyethylenenaphthalate (PEN), or polyethyleneterephthalate (PET), polyimide (PI), polysulfone (PSF), or fluoride resin, but are not limited thereto.

The first liquid crystal layer electrode 420 is provided on the first liquid crystal layer substrate 410, and the second liquid crystal layer electrode 440 is provided on the second liquid crystal layer substrate 450. The first and second electrodes 420 and 440 may be transparent electrodes. For example, the first and second electrodes 420 and 440 may be silver oxide (e.g., AgO or $Ag_2O$ or $Ag_2O_3$), aluminum oxide (e.g., $Al_2O_3$), tungsten oxide (e.g., $WO_2$ or $WO_3$ or $W_2O_3$), magnesium oxide (e.g., MgO), molybdenum oxide (e.g., $MoO_3$), zinc oxide (e.g., ZnO), tin oxide (e.g., $SnO_2$, indium oxide (e.g., $In_2O_3$), chromium oxide (e.g., $CrO_3$ or $Cr_2O_3$), antimony oxide (e.g., $Sb_2O_3$ or $Sb_2O_5$), titanium oxide (e.g., $TiO_2$), nickel oxide (e.g., NiO), copper oxide (e.g., CuO or $Cu_2O$), vanadium oxide (e.g., $V_2O_3$ or $V_2O_5$), cobalt oxide (e.g., CoO), iron oxide (e.g., $Fe_2O_3$ or $Fe_3O_4$), niobium oxide (e.g., $Nb_2O_5$), indium tin oxide (e.g., ITO), indium zinc oxide (e.g., IZO), aluminum doped zinc oxide (e.g., ZAO), aluminum doped tin oxide (e.g., TAO), or antimony tin oxide (e.g., ATO), but are not limited thereto.

The liquid crystal layer 430 may be located between the first liquid crystal layer substrate 410 and the second liquid crystal layer substrate 450. The liquid crystal layer 430 may be a polymer dispersed liquid crystal layer (PDLC). FIG. 8 illustrates that one liquid crystal layer 430 is located between the first liquid crystal layer substrate 410 and the second liquid crystal layer substrate 450, but the present disclosure is not limited thereto. That is, a plurality of liquid crystal layers 430 may also be located between the first liquid crystal layer substrate 410 and the second liquid crystal layer substrate 450. A refractive index anisotropy of the liquid crystal layer 430 is not limited to, but may be 0.10 to 0.25 or 0.05 to 0.30. In addition, a dielectric anisotropy of the liquid crystal layer 430 is not limited to, but may be 3 to 30 or 10 to 20.

The liquid crystal layer 430 includes a polymer 431 and a plurality of droplets 432. Each of the plurality of droplets 432 may include a plurality of liquid crystals 433 (or liquid crystal molecules). That is, the plurality of liquid crystals 433 may be dispersed into the plurality of droplets 432 by the polymer 431. The plurality of liquid crystals 433 may be nematic liquid crystals whose arrangement is changed by a vertical electric field of the first and second electrodes 420 and 440, that is, an electric field in the third direction DR3, but are not limited thereto.

According to some embodiments, the plurality of droplets 432 may further include a plurality of dichroic dyes to implement a black light blocking mode. The plurality of dichroic dyes may be dyes that absorb light. For example, the plurality of dichroic dyes may be black dyes that absorb all light in a visible light wavelength band or dyes that absorb light other than a wavelength band of a specific color (e.g., red) and reflect light of a wavelength band of a specific color (e.g., red). Therefore, as the plurality of droplets 432 include the plurality of dichroic dyes, the liquid crystal layer 430 may absorb and block light.

The liquid crystal layer 430 may be implemented in a light blocking mode that blocks light or a 2D image mode that transmits light by controlling a voltage applied to the first and second electrodes 420 and 440. That is, by controlling the voltage applied to the first and second electrodes 420 and 440, the liquid crystal layer 430 may be varied between a 3D hologram mode in which light transmission control layer 40 is blocked and a 2D mode in which light transmission control layer 40 is transmitted. Hereinafter, the light blocking mode and the 2D image mode of the liquid crystal layer 430 will be described in more detail with reference to FIGS. 11 and 12.

Figure 11:
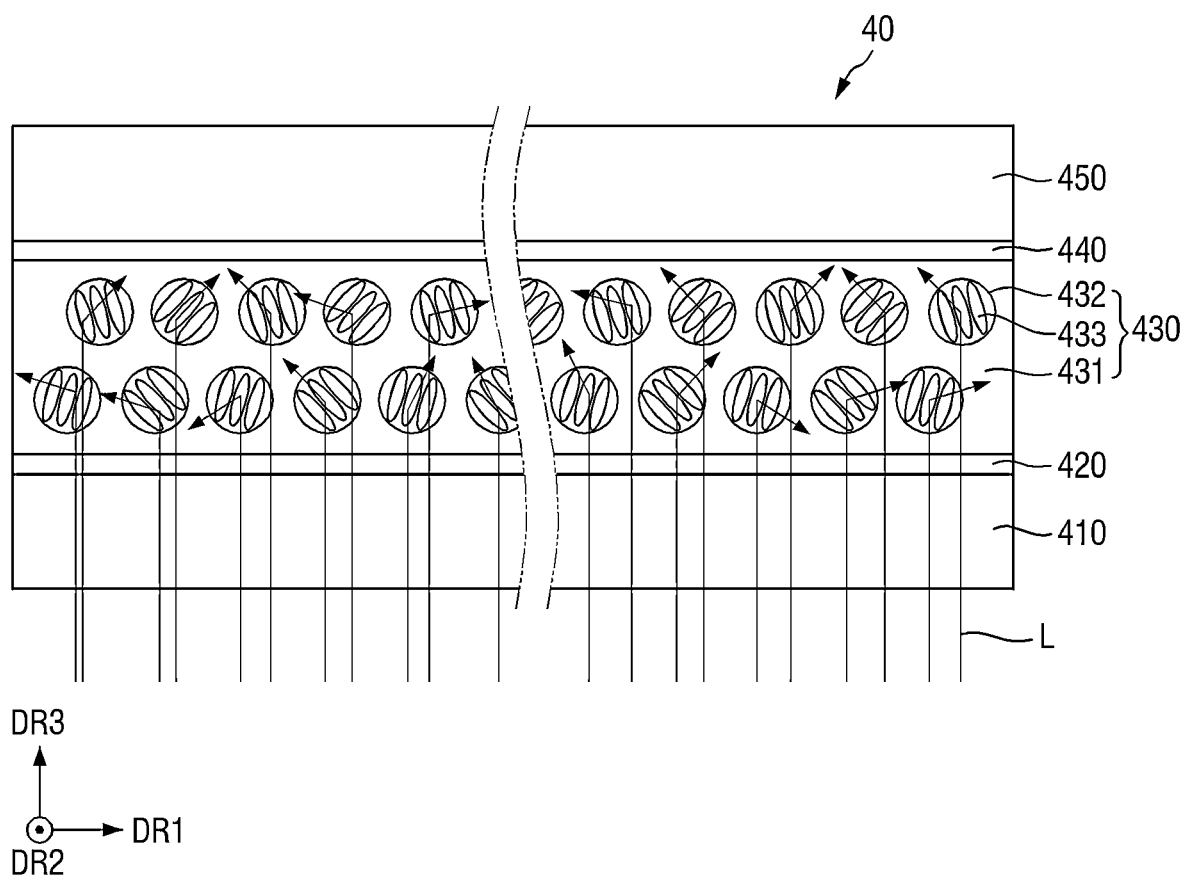
FIGS. 11 and 12 are views illustrating a light path of the light transmission control layer of the display device according to some embodiments.

Referring to FIG. 11, when no voltage is applied to the first and second electrodes 420 and 440 or when a difference between a first voltage applied to the first liquid crystal layer electrode 420 and a second voltage applied to the second liquid crystal layer electrode 440 is smaller than a threshold value, the plurality of liquid crystals 433 of the liquid crystal layer 430 are randomly arranged. In this case, light incident on the liquid crystal layer 430 is scattered by the liquid crystals 433. Therefore, as will be described later, in the 3D hologram mode, the liquid crystal layer 430 may block light incident to the light transmission control layer 40 from transmitting through the light transmission control layer 40.

According to some embodiments, the liquid crystal layer 430 may further include a voltage supply unit supplying a voltage (e.g., a set or predetermined voltage) to each of the first and second electrodes 420 and 440. By controlling an arrangement of the plurality of liquid crystals 433 included in the liquid crystal layer 430 according to the voltage applied to the first liquid crystal layer electrode 420 and the voltage applied to the second liquid crystal layer electrode 440, the liquid crystal layer 430 may be implemented in a light blocking mode that blocks incident light or a 2D image mode that transmits incident light.

When the difference between the first voltage applied to the first liquid crystal layer electrode 420 and the second voltage applied to the second liquid crystal layer electrode 440 is greater than the threshold value, the plurality of liquid crystals 433 of the liquid crystal layer 430 are arranged in the third direction DR3 by a vertical electric field formed between the first liquid crystal layer electrode 420 and the second liquid crystal layer electrode 440, that is, an electric field in the third direction DR3. In this case, the plurality of liquid crystals 433 are arranged in a direction in which light is incident, and because a refractive index between the polymer 431 of the liquid crystal layer 430 and the first liquid crystals 433 is minimized, scattering of light incident on the liquid crystal layer 430 is minimized. Accordingly, most of the light incident on the liquid crystal layer 430 may pass through the liquid crystal layer 430 as it is.

Figure 12:
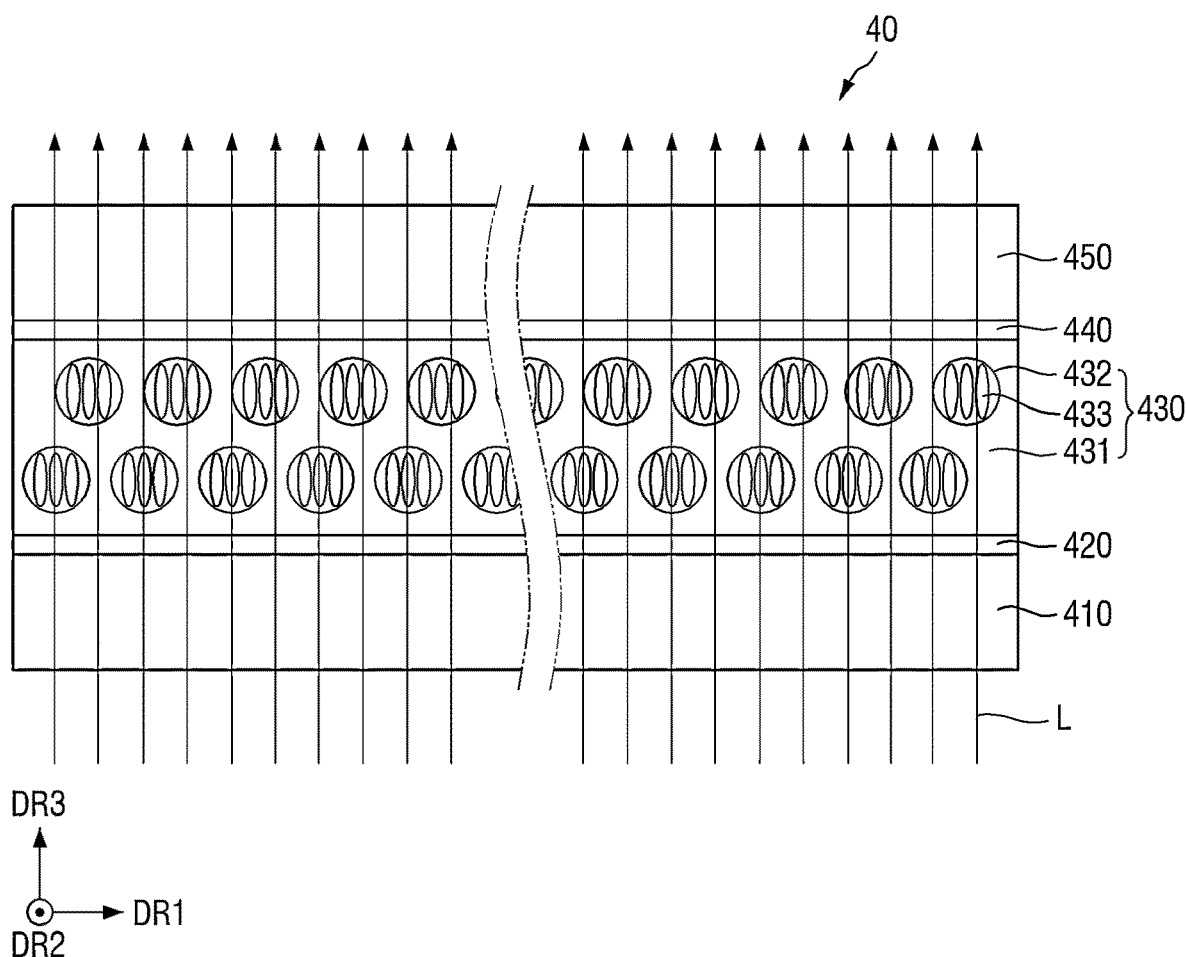

Referring to FIG. 12, in the 2D mode, a transmittance of the first light blocking display area DA1 through which light is transmitted may vary. That is, as the light transmission control layer 40 adjusts the transmittance through which light is transmitted, the transmittance in the first light blocking display area DA1 may be adjusted. Accordingly, user convenience can be improved.

For example, according to some embodiments, the first light blocking display area DA1 includes the display light transmission layer 12 and the light transmission control layer 40 including the light transmitting portion TA. Therefore, when the light transmission control layer 40 is changed to the 2D image mode, not only light is transmitted through the display light transmission layer 12, but also light is transmitted through the light transmission control layer 40.

As a result, an object positioned behind the first light blocking display area DA1 may be visually recognized through the first light blocking display area DA1. In this state, the first light blocking display area DA1 may display images and videos. That is, through the first light blocking display area DA1, the user may visually recognize the object positioned behind the display device 1 and at the same time visually recognize reverse images and videos displayed in the first light blocking display area DA1. In addition, by variously changing the transmittance through which light transmits through the light transmission control layer 40, a sharpness of the object positioned behind the display device 1 that may be confirmed through the first light blocking display area DA1 may also be adjusted.

Figure 13:
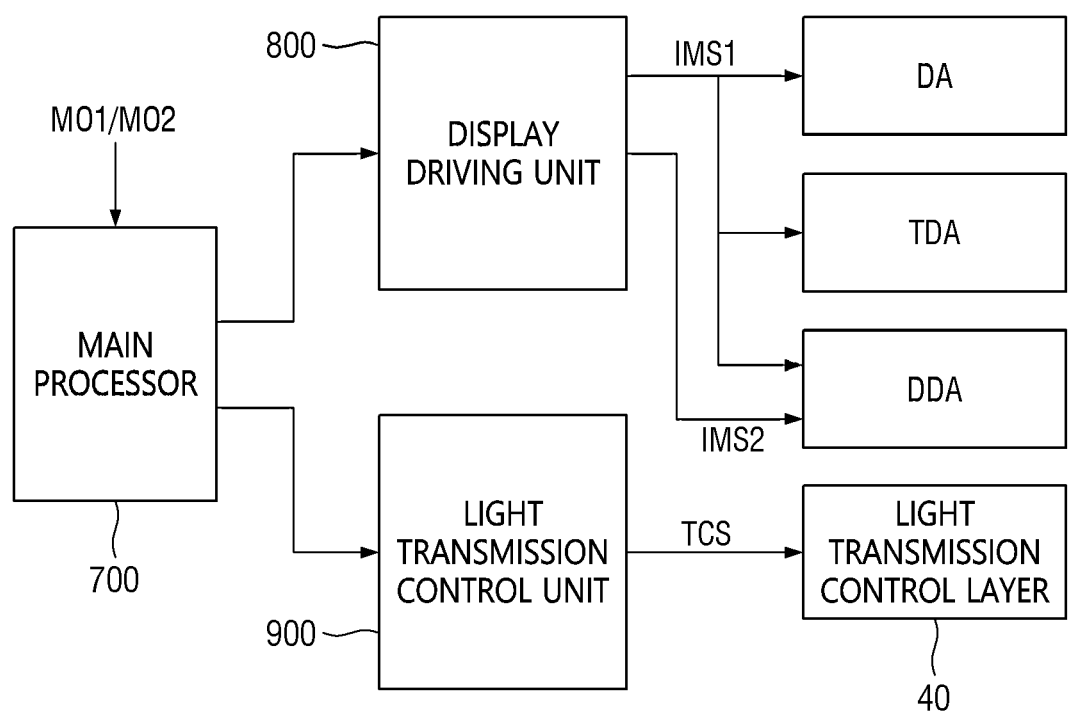
FIG. 13 is a block diagram illustrating a method of driving a 2D image or a 3D hologram image of a display device according to some embodiments.

FIG. 13 is a block diagram illustrating a method of driving a 2D image or a 3D hologram image of a display device according to some embodiments.

Referring to FIG. 13, a main processor 700 may receive a first mode signal MO1 or a second mode signal MO2 according to a user's or host's selection. The main processor 700 may drive the display device 1 in a 2D mode according to the first mode signal MO1. For example, the main processor 700 may receive the first mode signal MO1 and control the display driving unit to display the image in the display dedicated area DDA, the light transmission display area TDA, and the light blocking display area DA. In addition, the main processor 700 may receive the first mode signal MO1 and control a light transmission control unit 900 to control the light transmission control layer 40. Accordingly, the main processor 700 may display a 2D image on the display device 1 according to the first mode signal MO1. In this case, as described above, the display device 1 may be in a non-folded state.

In addition, the main processor 700 may receive the second mode signal MO2 and control the display driving unit to display an image in the display dedicated area DDA. In addition, the main processor 700 may receive the second mode signal MO2 and control the light transmission control unit 900 to control the light transmission control layer 40. Accordingly, the main processor 700 may display a 3D image on the display device 1 according to the second mode signal MO2. In this case, as described above, the display device 1 may be in-folded to have a triangular pyramid shape.

The display driving unit may be driven to display images in the display dedicated area DDA, the light transmission display area TDA, and the light blocking display area DA from the signal received from the main processor 700. For example, in the case of the 2D mode, the display driving unit may output a first mode image IMS1 to the display dedicated area DDA, the light transmission display area TDA, and the light blocking display area DA. In this case, as described above, the display device 1 may be in a non-folded state.

In addition, in the case of the 3D hologram mode, the display driving unit may output a second mode image IMS2 to the display dedicated area DDA. The display driver may not output the second mode image IMS2 to the light transmission display area TDA and the light blocking display area DA. In this case, as described above, the display device 1 may be in-folded to have a triangular pyramid shape.

The light transmission control unit 900 may control the light transmission control layer 40 from the signal received from the main processor 700. For example, in the case of the 2D mode, the light transmission control unit 900 may output a light transmission control signal TCS to control the light transmission control layer 40 so that the light transmission control layer 40 transmits external light. In addition, in the 3D hologram mode, the light transmission control unit 900 may output a light transmission control signal TCS to control the light transmission control layer 40 so that the light transmission control layer 40 blocks external light.

Figure 14:
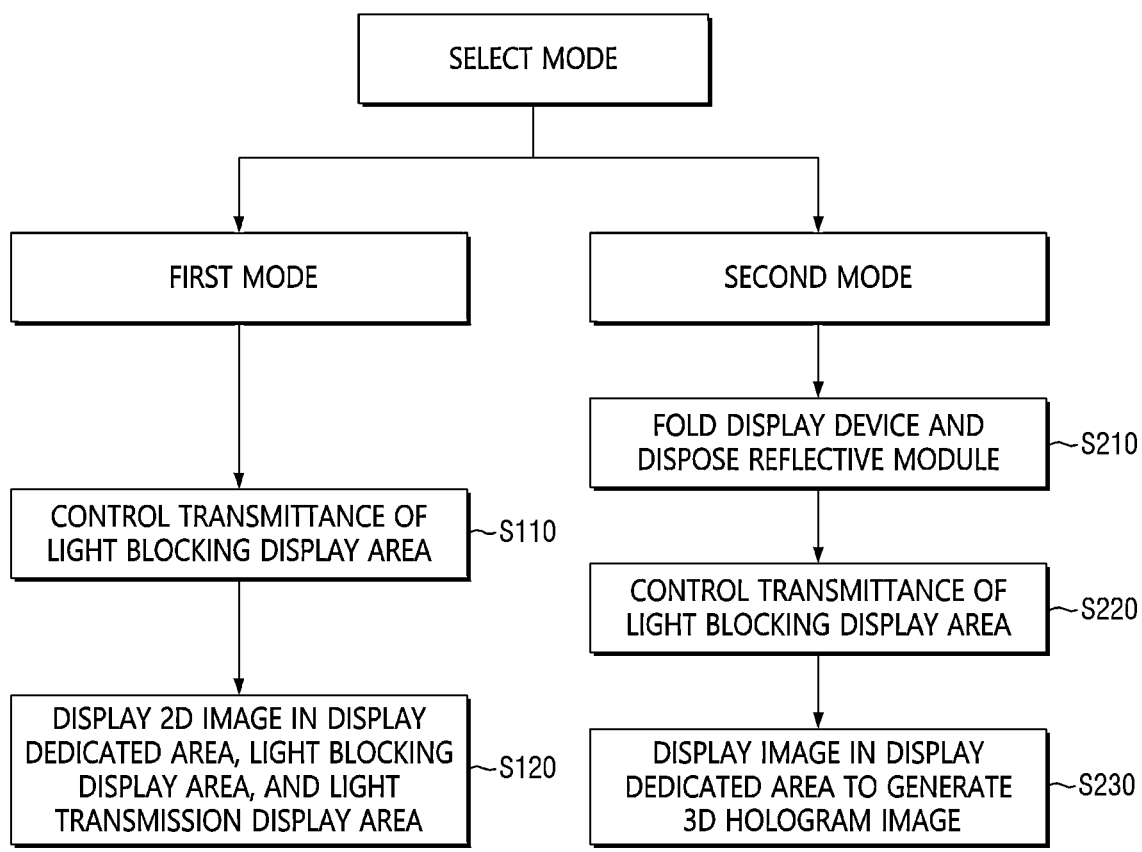
FIG. 14 is a flowchart illustrating a method of driving a 2D image or a 3D hologram image of a display device according to some embodiments.
Figure 15:
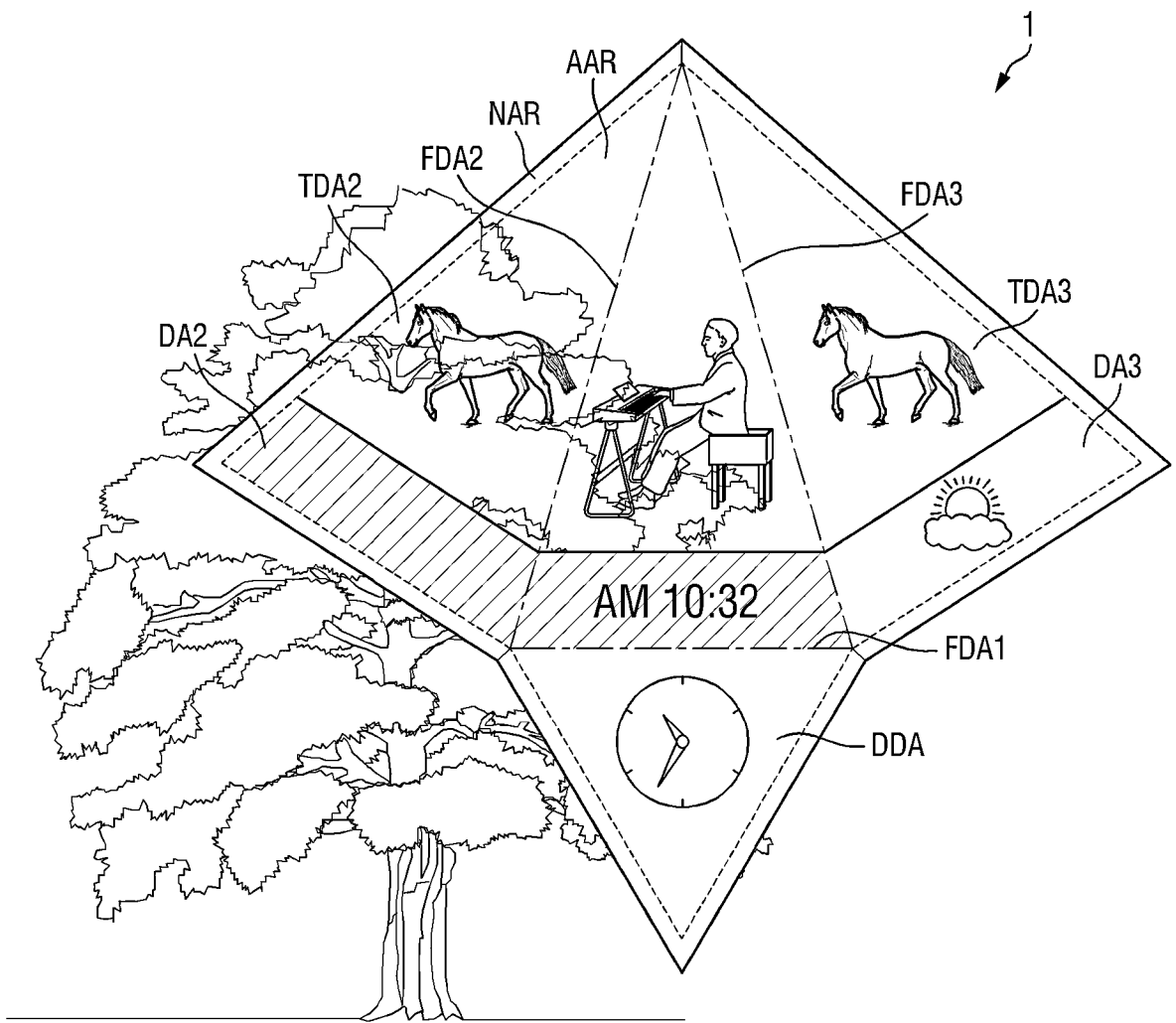
FIG. 15 is a perspective view illustrating the display device operating in a non-folding state according to some embodiments.
Figure 15:
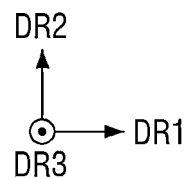
Figure 16:
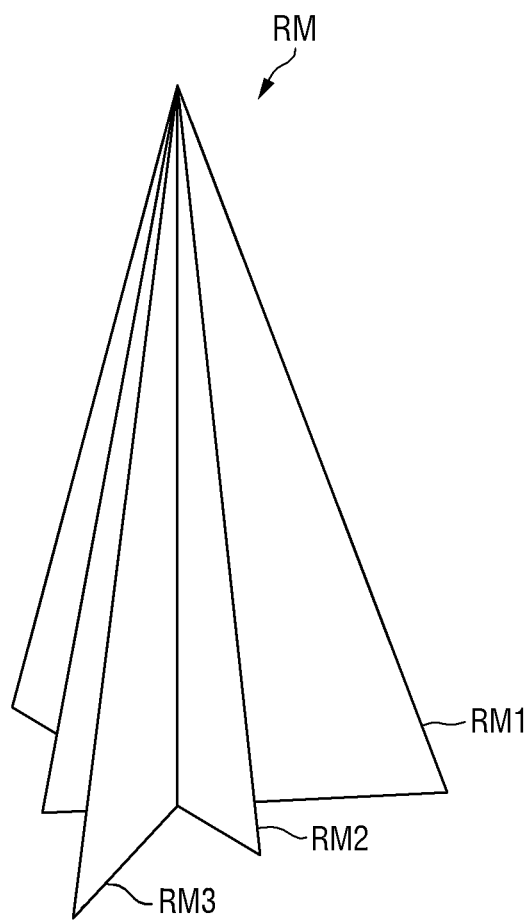
FIG. 16 is a perspective view illustrating a reflective module according to some embodiments.
Figure 17:
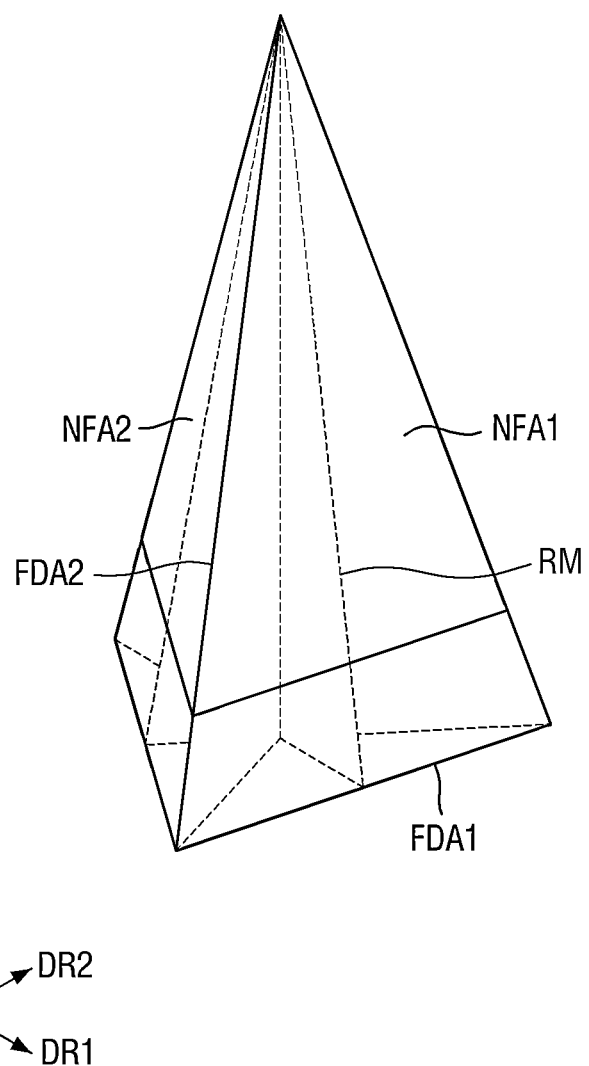
FIG. 17 is a perspective view illustrating a reflective module and a display device according to some embodiments.
Figure 18:
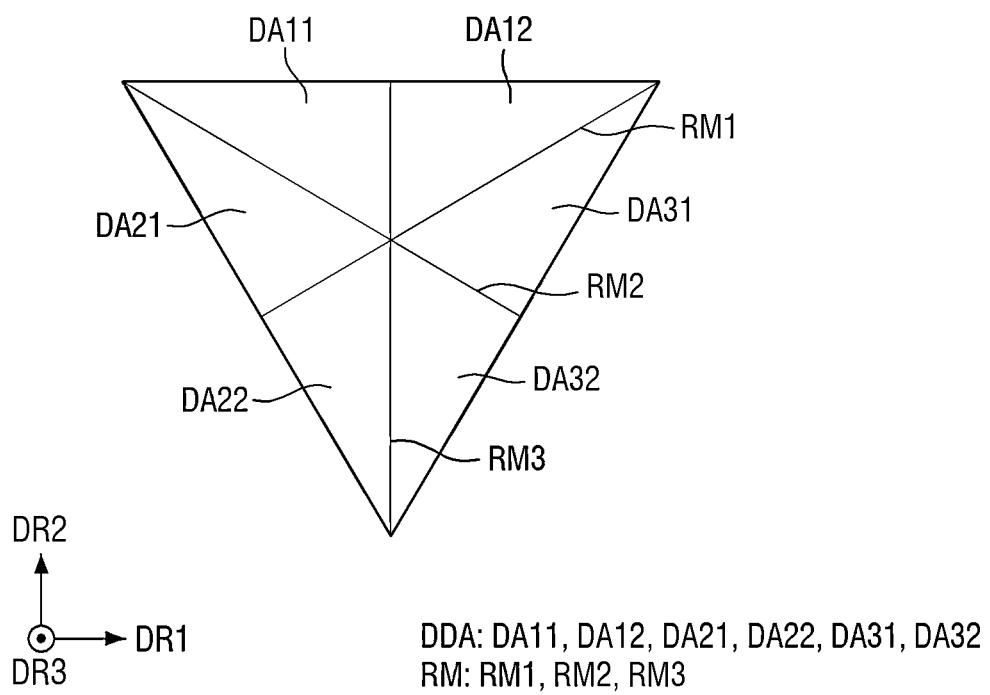
FIG. 18 is a plan view illustrating a reflective module and a display device according to some embodiments.
Figure 19:
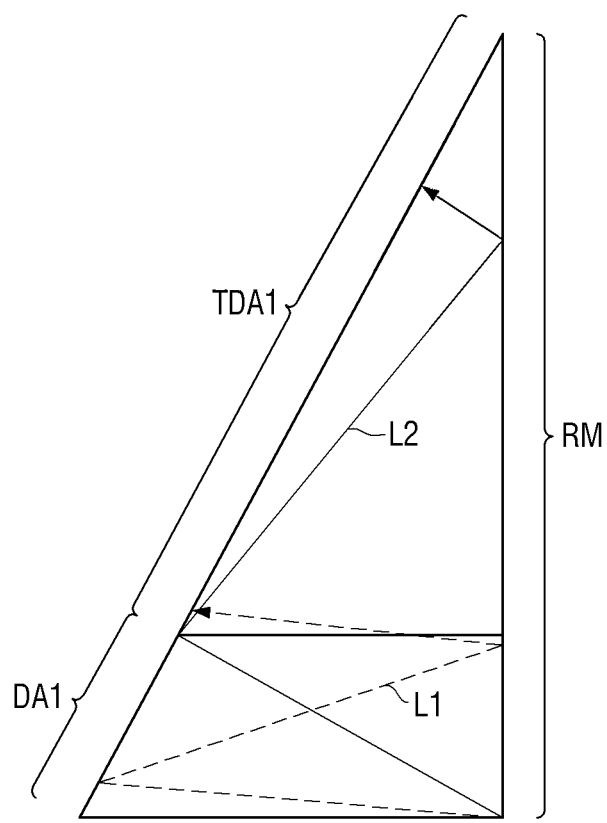
FIG. 19 is a cross-sectional view illustrating a reflective module and a display device according to some embodiments.
Figure 20:
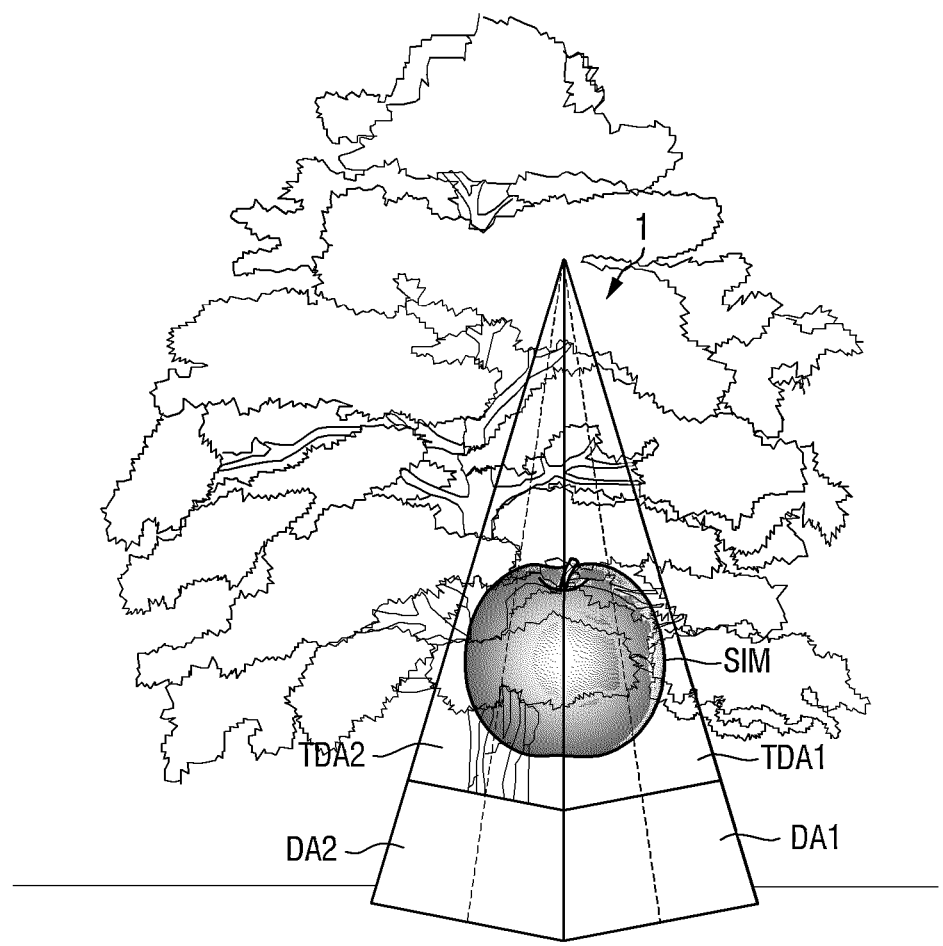
FIG. 20 is a perspective view illustrating the display device operating in a folding state according to some embodiments.

FIG. 14 is a flowchart illustrating a method of driving a 2D image or a 3D hologram image of a display device according to some embodiments. FIG. 15 is a perspective view illustrating the display device operating in a non-folding state according to some embodiments. FIG. 16 is a perspective view illustrating a reflective module according to some embodiments. FIG. 17 is a perspective view illustrating a reflective module and a display device according to some embodiments. FIG. 18 is a plan view illustrating a reflective module and a display device according to some embodiments. FIG. 19 is a cross-sectional view illustrating a reflective module and a display device according to some embodiments. FIG. 20 is a perspective view illustrating the display device operating in a folding state according to some embodiments.

A method of displaying a 2D image or a 3D holographic image by the display device 1 will be described with reference to FIGS. 14 to 20.

Referring to FIG. 14, first, in a first mode, the main processor 700 controls a transmittance of the light blocking display area DA (S110). As described above, the first mode may be the 2D video mode.

In a 2D mode, the main processor 700 controls the light transmission control layer 40 to transmit external light. For example, by controlling the voltage applied to the first and second electrodes 420 and 440, the 2D mode in which the light transmission control layer 40 is transmitted may be set. When the difference between the first voltage applied to the first liquid crystal layer electrode 420 and the second voltage applied to the second liquid crystal layer electrode 440 is greater than the threshold value, the plurality of liquid crystals 433 of the liquid crystal layer 430 are arranged in a vertical electric field formed between the first liquid crystal layer electrode 420 and the second liquid crystal layer electrode 440. In this case, the plurality of liquid crystals 433 are arranged in a direction in which light is incident, and because a refractive index between the polymer 431 of the liquid crystal layer 430 and the first liquid crystals 433 is minimized, scattering of light incident on the liquid crystal layer 430 is minimized. Accordingly, most of the light incident on the liquid crystal layer 430 may pass through the liquid crystal layer 430 as it is.

Next, the main processor 700 may control to display an image in the display dedicated area DDA, the light transmission display area TDA, and the light blocking display area DA (S120).

Referring further to FIG. 15, accordingly, a transmittance of the first light blocking display area DA1 through which light is transmitted may vary. That is, as the light transmission control layer 40 adjusts the transmittance through which light is transmitted, external light may transmit through the light blocking display area DA.

For example, when the light transmission control layer 40 is in the light blocking mode in a state in which the display device 1 is in-folded, the user may not visually recognize the videos and images displayed in the display dedicated area DDA. However, in the case of changing the light transmission control layer 40 to the 2D image mode in the first mode, because light is transmitted not only through the display light transmission layer 12, but also through the light transmission control layer 40, the videos and images displayed in the light blocking display area DA may be visually recognized from the outside through the rear surface of the light blocking display area DA. That is, the user may visually recognize the videos and images displayed through the rear surfaces of the light blocking display area DA and the light transmission display area TDA. On the other hand, because the display dedicated area DDA does not include the light transmitting portion TA, the videos and images may not be visually recognized from the outside through a rear surface of the display dedicated area DDA.

Meanwhile, in the case of the 3D hologram mode, first, the user folds the display device 1 and arranges the reflective module RM on the display device 1 (S210).

The reflective module RM will be described with reference to FIGS. 16 to 18. The reflective module RM includes a first reflective member RM1, a second reflective member RM2, and a third reflective member RM3. The reflective module RM includes a material having a high light reflectance. For example, the reflective module RM may be made of a material having a high reflectance that reflects external light when the external light is incident thereon.

In the 3D hologram mode, the reflective module RM may be adjacent to the display device 1. For example, as in the embodiments illustrated and described with respect to FIG. 17, when the display device 1 is in-folded and has the triangular pyramid shape, the reflective module RM may be adjacent to the first to fourth non-folding areas NFA1 to NFA4.

For example, the first reflective member RM1 may be in contact with the fourth non-folding area NFA4 and extend in the third direction DR3. In addition, the first reflective member RM1 may be in contact with the second non-folding area NFA2. That is, the first reflective member RM1 may have a triangular shape. In addition, the second reflective member RM2 may be in contact with the fourth non-folding area NFA4 and extend in the third direction DR3. The second reflective member RM2 may be in contact with the third folding line FDA3 and the first non-folding area NFA1. That is, the second reflective member RM2 may have a triangular shape. In addition, the third reflective member RM3 may be in contact with the fourth non-folding area NFA4 and extend in the third direction DR3. In addition, the third reflective member RM3 may be in contact with the second folding line FDA2 and the third non-folding area NFA3. That is, the second reflective member RM2 may have a triangular shape.

Referring further to FIG. 18, the first reflective member RM1 may be located at a boundary between the twelfth display dedicated area DA12 and the thirty-first display dedicated area DA31 of the display dedicated area DDA. The first reflective member RM1 may be located at a boundary between the twenty-first display dedicated area DA21 and the twenty-second display dedicated area DA22 of the display dedicated area DDA. In addition, the second reflective member RM2 may be located at a boundary between the eleventh display dedicated area DA11 and the twenty-first display dedicated area DA21 of the display dedicated area DDA. The second reflective member RM2 may be located at a boundary between the thirty-first display dedicated area DA31 and the thirty-second display dedicated area DA32 of the display dedicated area DDA. In addition, the third reflective member RM3 may be located at a boundary between the twenty-second display dedicated area DA22 and a thirty-third display dedicated area DA33 of the display dedicated area DDA. The third reflective member RM3 may be located at a boundary between the eleventh display dedicated area DA11 and the twelfth display dedicated area DA12 of the display dedicated area DDA.

Next, the main processor 700 controls a transmittance of the light blocking display area DA (S220). As described above, the second mode may be the 3D hologram mode.

In the second mode, the main processor 700 controls the light transmission control layer 40 to transmit external light. For example, by controlling the voltage applied to the first and second electrodes 420 and 440, the 3D hologram mode in which the light transmission control layer 40 is transmitted may be set. When no voltage is applied to the first and second electrodes 420 and 440 or when a difference between a first voltage applied to the first liquid crystal layer electrode 420 and a second voltage applied to the second liquid crystal layer electrode 440 is smaller than a threshold value, the plurality of liquid crystals 433 of the liquid crystal layer 430 are randomly arranged. In this case, light incident on the liquid crystal layer 430 is scattered by the liquid crystals 433. Therefore, in the 3D hologram mode, the liquid crystal layer 430 may block light incident to the light transmission control layer 40 from transmitting through the light transmission control layer 40.

Finally, the main processor 700 may control to display an image in the display dedicated area DDA (S230).

Referring further to FIGS. 19 and 20, as the light transmission control layer 40 adjusts the transmittance through which light is transmitted, the light blocking display area DA blocks external light.

For example, when the light transmission control layer 40 is blocked in a state in which the display device 1 is in-folded, the light blocking display area DA blocks external light, and the light transmission display area TDA transmits the external light.

Accordingly, when the main processor 700 displays the image in the display dedicated area DDA, first light L1 and second light L2 emitted from the display dedicated area DDA are each reflected by the first light blocking display area DA1 and reflected again by the reflective module RM. In this case, because the first light transmission display area TDA1 may transmit light, the light emitted from the display dedicated area DDA may transmit through the first light transmission display area TDA1. That is, the user may visually recognize the hologram image SIM displayed in the display dedicated area DDA. Meanwhile, because the first to third light transmission display areas TDA1 to TDA3 transmit external light, the user may recognize an external background in addition to the display dedicated area DDA.

In summary, according to the user's convenience, the user may recognize the videos and images displayed in the first to fourth non-folding areas NFA1 to NFA4 and recognize the external background in the first to third non-folding areas NFA1 to NFA3 in the first mode, or may visually recognize the 3D hologram image SIM displayed in the display dedicated area DDA and the external background through the first to third light transmission display areas TDA1 to TDA3.

Figure 21:
FIG. 21 is a schematic view illustrating an arrangement of pixels and light transmitting portions for each area of a display panel according to some embodiments.
Figure 22:
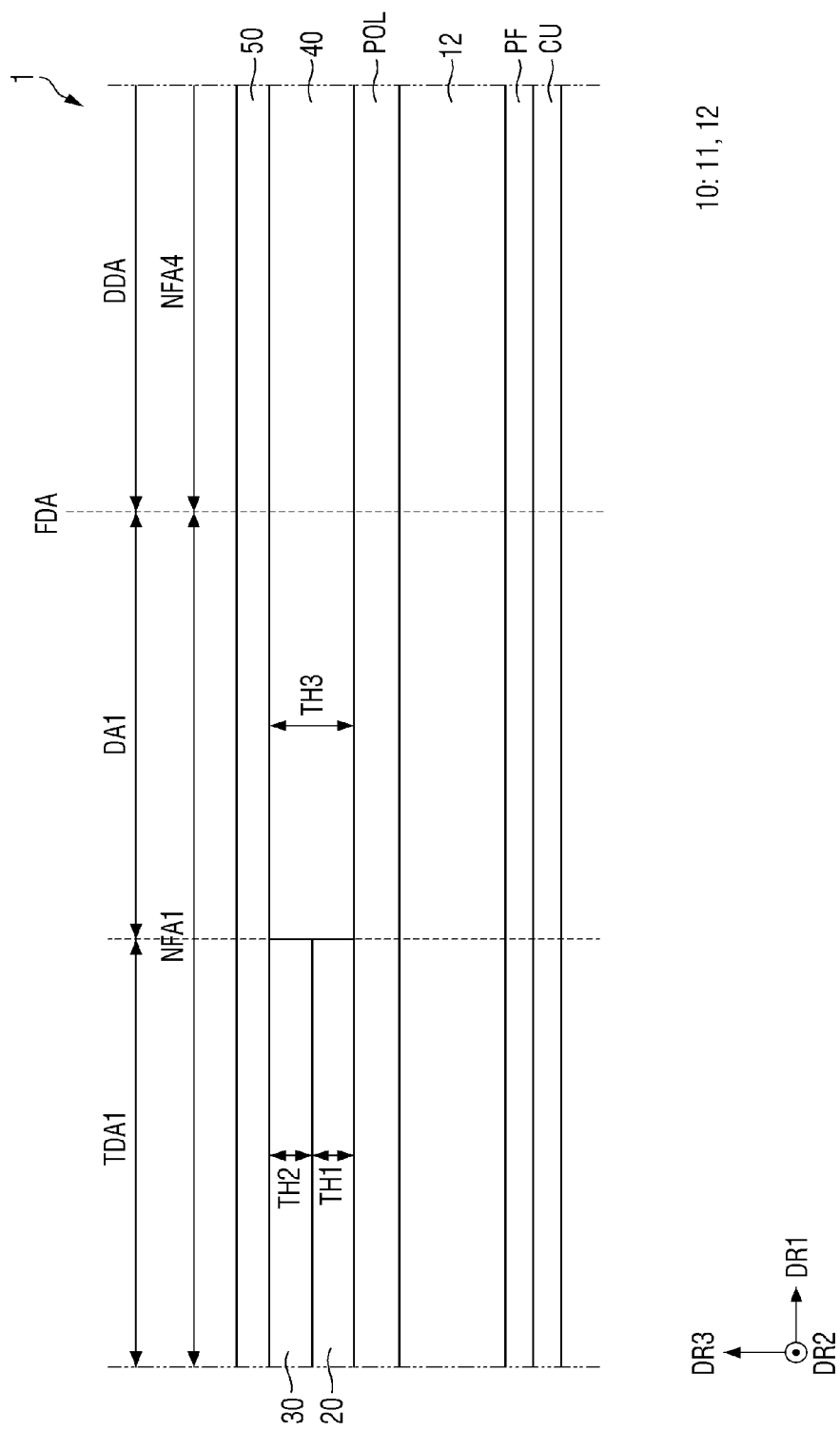
FIG. 22 is a cross-sectional view illustrating a state in which the display device is not folded according to some embodiments.

FIG. 21 is a schematic view illustrating an arrangement of pixels and light transmitting portions for each area of a display panel according to some embodiments. FIG. 22 is a cross-sectional view illustrating a state in which the display device is not folded according to some embodiments.

embodiments of FIGS. 21 and 22 are substantially the same as the embodiments of FIGS. 5 and 9 to 12 except for the arrangement of the pixels and light transmitting portions and the light transmission control layer 40 of the fourth non-folding area NFA4 of the display device 1. Therefore, differences between the embodiments illustrated and described with respect to FIGS. 21 and 22 and the embodiments illustrated and described with respect to FIGS. 5 and 9 to 12 will be mainly described.

Referring to FIG. 21, according to some embodiments, the first non-folding area NFA1 to the fourth non-folding area NFA4 include a red pixel PX_R, a green pixel PX_G, and a blue pixel PX_B, respectively. In addition, the first non-folding area NFA1 to the fourth non-folding area NFA4 further include a light transmitting portion TA in addition to the pixel PX. A size of the light transmitting portion TA is the same as that of the pixel PX, but is not limited thereto. According to some embodiments, the fourth non-folding area NFA4 may be a display dedicated area DDA.

In the first non-folding area NFA1 to the fourth non-folding area NFA4, the pixels PX and the light transmitting portions TA are alternately arranged in the first direction DR1. Pixels PX of different colors are arranged along the first direction DR1. For example, in the first non-folding area NFA1 to the fourth non-folding area NFA4, a red pixel PX_R, a light transmitting portion TA, a green pixel PX_G, a light transmitting portion TA, a blue pixel PX_B, and a light transmitting portion TA are arranged in this order along the first direction DR1. In the second direction DR2, pixels PX of the same color are arranged or light transmitting portions TA are arranged. In the first non-folding area NFA1 to the fourth non-folding area NFA4, the number of pixels PX and the number of light transmitting portions TA may be the same. In addition, in the first non-folding area NFA1 to the fourth non-folding area NFA4, an area of the pixel PX and an area of the light transmitting portion TA may be the same. That is, a ratio of the area of the light transmitting portion TA to the total area of the first non-folding area NFA1 to the fourth non-folding area NFA4 may be 50%.

When the pixels PX and the light transmitting portions TA are alternately arranged in the first non-folding area NFA1 to the fourth non-folding area NFA4 (in other words, when the light transmitting portions TA are each located between the pixels PX), a presence of the light transmitting portion TA may not be visually recognized well, compared to a case in which the light transmitting portion TA having a large area is formed without an intervention of the pixel PX. At the same time, the first non-folding area NFA1 to the fourth non-folding area NFA4 may be used as a transparent display by transmitting light through the light transmitting portion TA as described above.

Referring further to FIG. 22, a polarization member POL may be located on an upper side of the display panel. The polarization member POL polarizes light passing therethrough. The polarization member POL may serve to reduce reflection of external light.

A step compensation layer 20 and a protective window 30 may be located in the first light transmission display area TDA1 of the first non-folding area NFA1 on the polarization member POL. A light transmission control layer 40 may be located in the first light blocking display area DA1 and the display dedicated area DDA of the first non-folding area NFA1 on the polarization member POL. The light transmission control layer 40 may be located on the same layer (e.g., the polarization member POL) as the step compensation layer 20, but is not limited thereto. When the step compensation layer 20 is located on the protective window 30, the light transmission control layer 40 may also be located on the same layer as the protective window 30. That is, the light transmission control layer 40 may be located outside the step compensation layer 20 and/or the protective window 30.

Some descriptions of the step compensation layer 20, the protective window 30, and the light transmission control layer 40 are substantially the same as those of the embodiments illustrated and described with respect to FIG. 5, and thus may be omitted.

The first light blocking display area DA1 is described in the embodiments of FIGS. 21 and 22, but because the second light blocking display area DA2 and the third light blocking display area DA3 are substantially the same as the first light blocking display area DA1, descriptions thereof will be omitted. In addition, the first light transmission display area TDA1 is described in the embodiments of FIGS. 21 and 22, but because the second light transmission display area TDA2 and the third light transmission display area TDA3 are substantially the same as the first light transmission display area TDA1, descriptions thereof will be omitted.

According to some embodiments, the first light blocking display area DA1 includes the display light transmission layer 12 and the light transmission control layer 40 including the light transmitting portion TA. Therefore, when the light transmission control layer 40 is changed to the 2D image mode, not only light is transmitted through the display light transmission layer 12, but also light is transmitted through the light transmission control layer 40. As a result, an object positioned behind the first light blocking display area DA1 may be visually recognized through the first light blocking display area DA1. In this state, the first light blocking display area DA1 may display images and videos. Meanwhile, when the light transmission control layer 40 is changed to the 3D hologram mode, the object positioned behind the first light blocking display area DA1 may not be visually recognized.

That is, through the first light blocking display area DA1, the user may visually recognize the object positioned behind the display device 1 and at the same time visually recognize reverse images and videos displayed in the first light blocking display area DA1.

In addition, the display dedicated area DDA also includes the display light transmission layer 12 and the light transmission control layer 40 including the light transmitting portion TA. Therefore, when the light transmission control layer 40 is changed to the 2D image mode, not only light is transmitted through the display light transmission layer 12, but also light is transmitted through the light transmission control layer 40. As a result, an object positioned behind the display dedicated area DDA may be visually recognized through the display dedicated area DDA.

Figure 23:
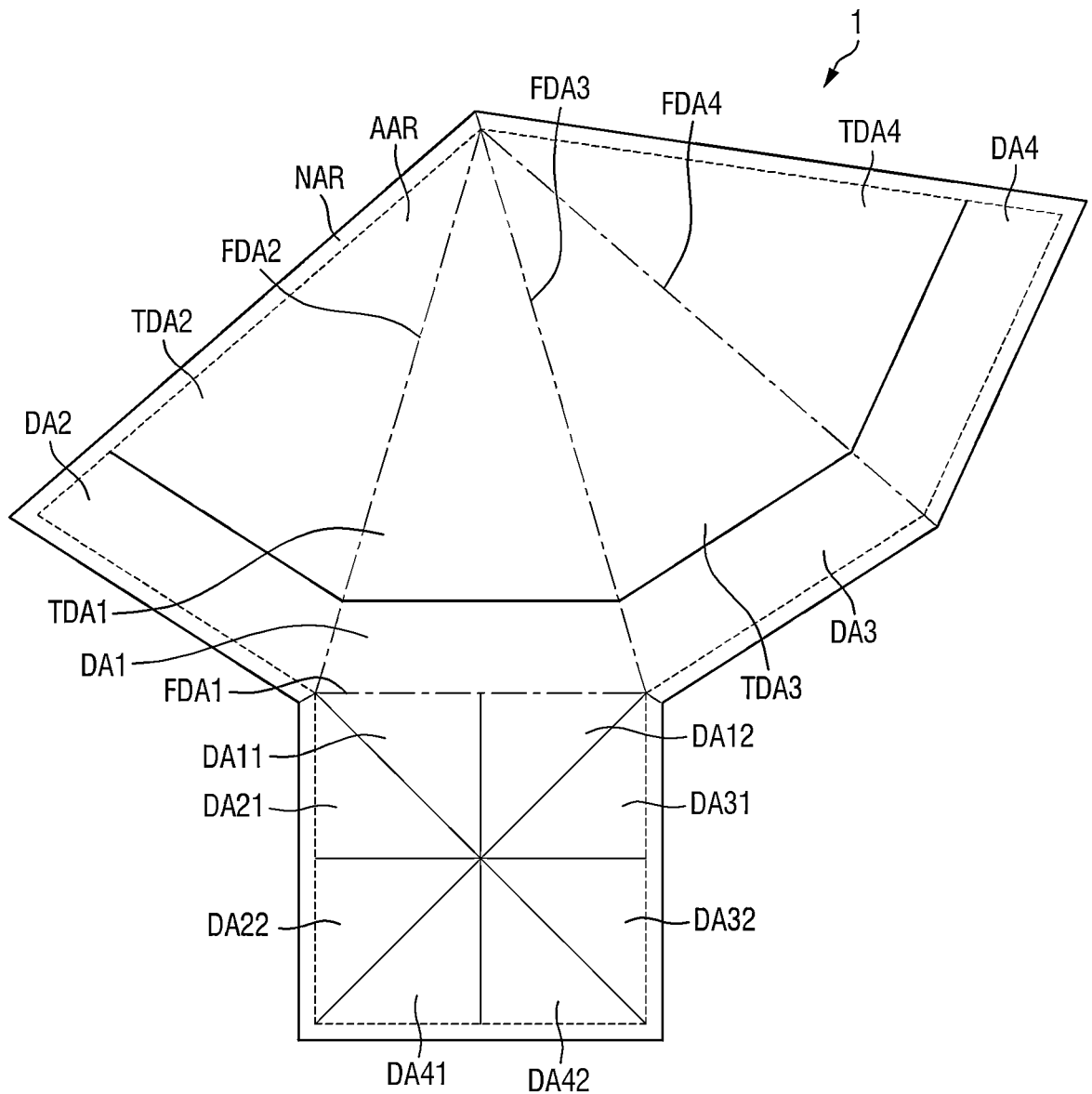
FIG. 23 is a plan view illustrating display areas of the display device according to some embodiments.
Figure 24:
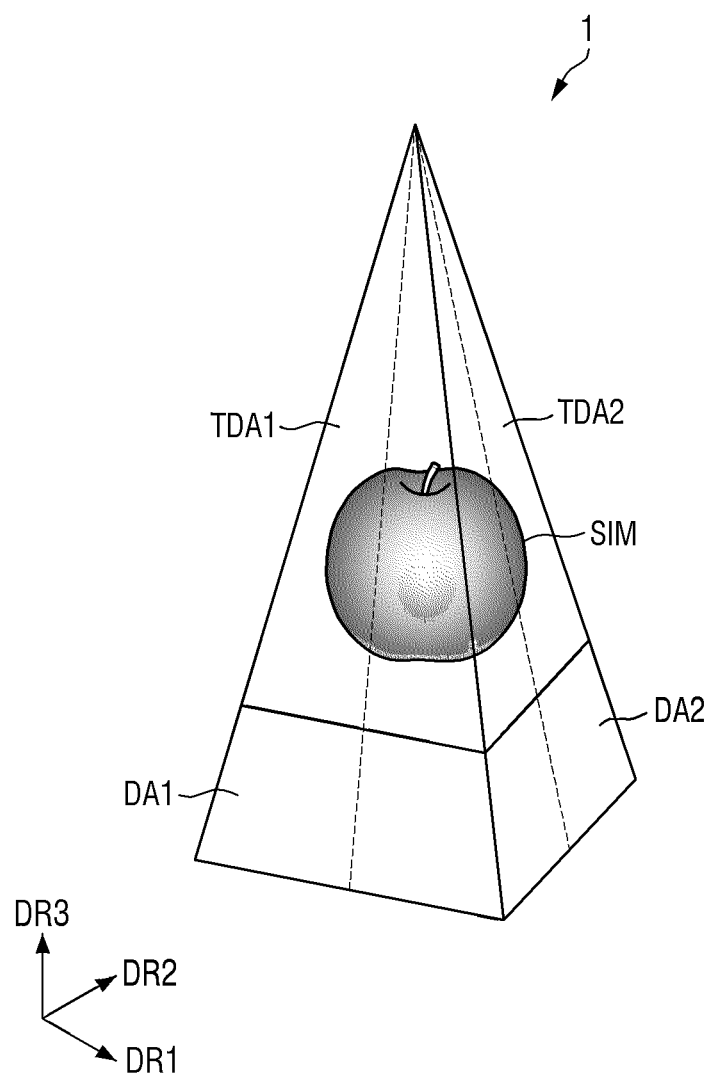
FIG. 24 is a perspective view illustrating the display device according to some embodiments.

FIG. 23 is a plan view illustrating display areas of the display device according to some embodiments. FIG. 24 is a perspective view illustrating the display device according to some embodiments.

embodiments of FIGS. 23 and 24 are substantially the same as the embodiments of FIGS. 1 to 4 except for an addition of a fourth light transmission display area TDA4 and a fourth light blocking display area DA4 of the display device 1. Therefore, differences between the embodiments illustrated and described with respect to FIGS. 21 and 22 and the embodiments illustrated and described with respect to FIGS. 1 to 4 will be mainly described.

Referring to FIG. 23, the display device 1 may include a light transmission display area TDA that transmits external light, a light blocking display area DA that blocks external light, and a display dedicated area DDA. For example, the active area AAR may be divided into the light transmission display area TDA and the light blocking display area DA depending on whether or not the active area AAR includes a light transmitting portion TA.

The light transmission display area TDA and the light blocking display area DA are areas in which display is performed while transmitting light, and may include a plurality of light transmitting portions TA separated from each other. The light transmitting portion TA is an area that itself does not emit light, and is a portion that transmits light in the thickness direction. The light may include not only light of a visible ray wavelength, but also light of near infrared and/or infrared wavelengths. The light transmitted by the light transmitting portion TA may further include light of near ultraviolet and/or ultraviolet wavelengths.

The light blocking display area DA includes a first light blocking display area DA1, a second light blocking display area DA2, a third light blocking display area DA3, and a fourth light blocking display area DA4. In addition, the light transmission display area TDA includes a first light transmission display area TDA1, a second light transmission display area TDA2, a third light transmission display area TDA3, and a fourth light transmission display area TDA4. Some description of each of the light blocking display area DA and the light transmission display area TDA is substantially the same as that of the embodiments illustrated and described with respect to FIG. 4, and thus may be omitted.

The display device 1 may have a plurality of triangular shapes and quadrangular shapes with one sides adjacent to each other in plan view. When the display device 1 is in-folded as illustrated in FIG. 23, the display device 1 may have a developed view shape of a quadrangular pyramid to have a quadrangular pyramid shape.

According to some embodiments, the display device 1 may be a foldable display device. In the present specification, the foldable display device refers to a display device capable of being folded, which may have both a folded state and a non-folded state. In addition, folding typically includes, but is not limited to, folding the display device at an angle of about 180°, and it may be understood that the display device is folded even when the display device is bent at an angle greater than 180° or less than 180°, for example, when the display device is bent at an angle greater than or equal to 90° and less than 180° or greater than or equal to 120° and less than 180°. Furthermore, regarding the folding state, even if the display device is not completely folded, the display device may be referred to as the folding state when the display device is in a bent state out of the non-folding state. For example, even if the display device is bent at an angle of less than 90°, the display device may be expressed as being in the folding state in order to distinguish the display device from the non-folding state when a maximum folding angle is 90° or more. For example, the display device 1 may be folded to have a quadrangular pyramid shape.

Figure 25:
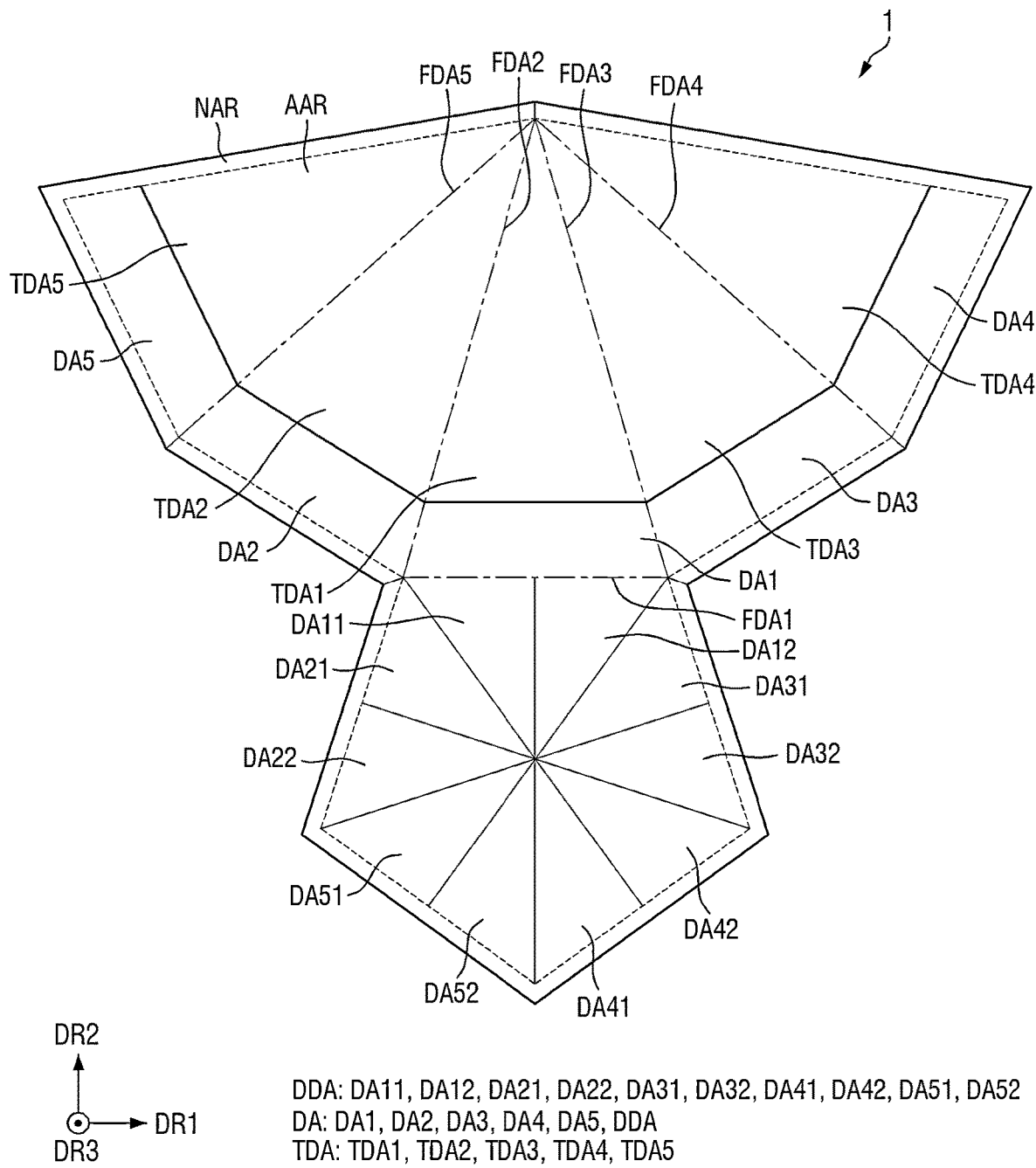
FIG. 25 is a plan view illustrating display areas of the display device according to some embodiments.
Figure 26:
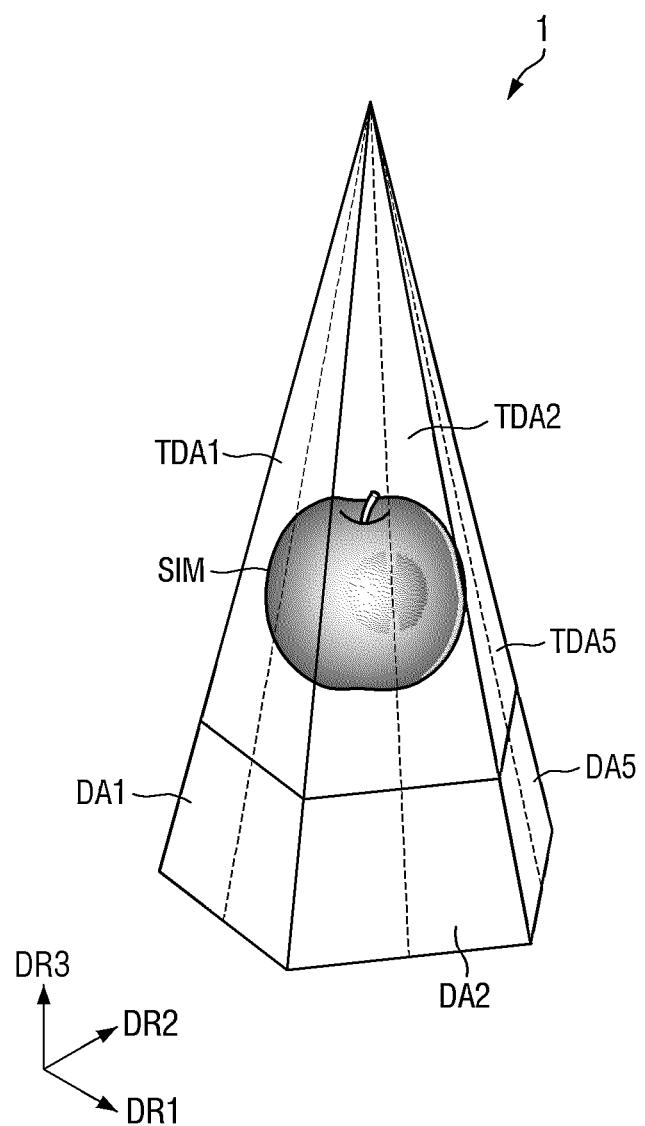
FIG. 26 is a perspective view of the display device according to some embodiments.

FIG. 25 is a plan view illustrating display areas of the display device according to some embodiments. FIG. 26 is a perspective view of the display device according to some embodiments.

The embodiments of FIGS. 25 and 26 are substantially the same as the embodiments of FIGS. 23 and 24 except for an addition of a fifth light transmission display area TDA5 and a fifth light blocking display area DA5 of the display device 1. Therefore, differences between the embodiments illustrated and described with respect to FIGS. 25 and 26 and the embodiments illustrated with respect to FIGS. 23 and 24 will be mainly described.

Referring to FIG. 25, the display device 1 may include a light transmission display area TDA that transmits external light, a light blocking display area DA that blocks external light, and a display dedicated area DDA. For example, the active area AAR may be divided into the light transmission display area TDA and the light blocking display area DA depending on whether or not the active area AAR includes a light transmitting portion TA.

The light transmission display area TDA and the light blocking display area DA are areas in which display is performed while transmitting light, and may include a plurality of light transmitting portions TA separated from each other. The light transmitting portion TA is an area that itself does not emit light, and is a portion that transmits light in the thickness direction. The light may include not only light of a visible ray wavelength, but also light of near infrared and/or infrared wavelengths. The light transmitted by the light transmitting portion TA may further include light of near ultraviolet and/or ultraviolet wavelengths.

The light blocking display area DA includes a first light blocking display area DA1, a second light blocking display area DA2, a third light blocking display area DA3, a fourth light blocking display area DA4, and a fifth light blocking display area DA5. In addition, the light transmission display area TDA includes a first light transmission display area TDA1, a second light transmission display area TDA2, a third light transmission display area TDA3, a fourth light transmission display area TDA4, and a fifth light transmission display area TDA5. Some description of each of the light blocking display area DA and the light transmission display area TDA is substantially the same as that of the embodiments illustrated and described with respect to FIG. 23, and thus may be omitted.

The display device 1 may have a plurality of triangular shapes and quadrangular shapes with one sides adjacent to each other in plan view. When the display device 1 is in-folded as illustrated in FIG. 25, the display device 1 may have a developed view shape of a quadrangular pyramid to have a quadrangular pyramid shape.

According to some embodiments, the display device 1 may be a foldable display device. In the present specification, the foldable display device refers to a display device capable of being folded, which may have both a folded state and a non-folded state. In addition, folding typically includes, but is not limited to, folding the display device at an angle of about 180°, and it may be understood that the display device is folded even when the display device is bent at an angle greater than 180° or less than 180°, for example, when the display device is bent at an angle greater than or equal to 90° and less than 180° or greater than or equal to 120° and less than 180°. Furthermore, regarding the folding state, even if the display device is not completely folded, the display device may be referred to as the folding state when the display device is in a bent state out of the non-folding state. For example, even if the display device is bent at an angle of less than 90°, the display device may be expressed as being in the folding state in order to distinguish the display device from the non-folding state when a maximum folding angle is 90° or more. For example, the display device 1 may be folded to have a pentagonal pyramid shape.

Figure 27:
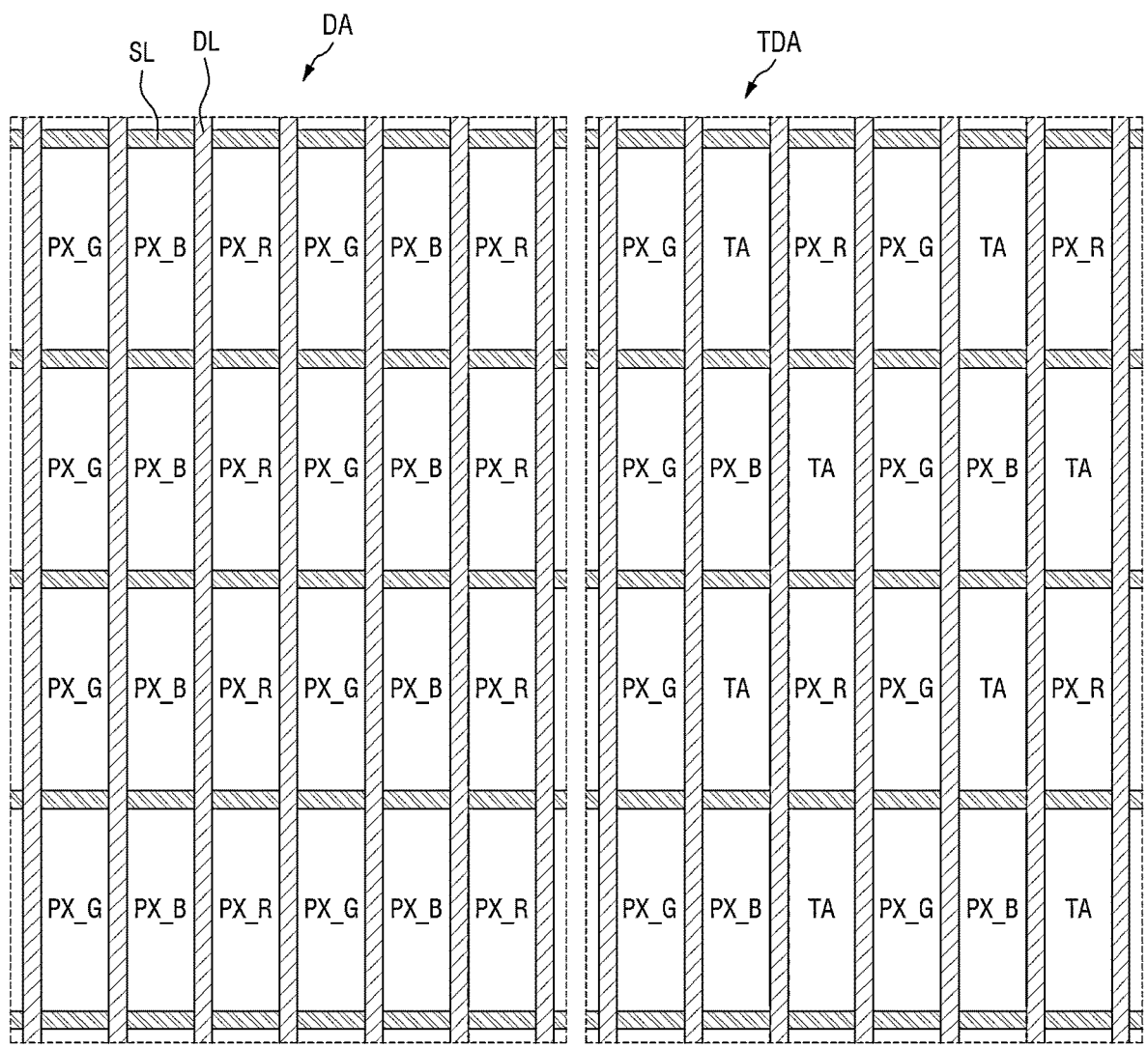
FIGS. 27 to 29 are schematic views illustrating an arrangement of pixels in a partial area of a light transmission display area and a partial area of a light blocking display area of a display panel according to some embodiments.
Figure 28:
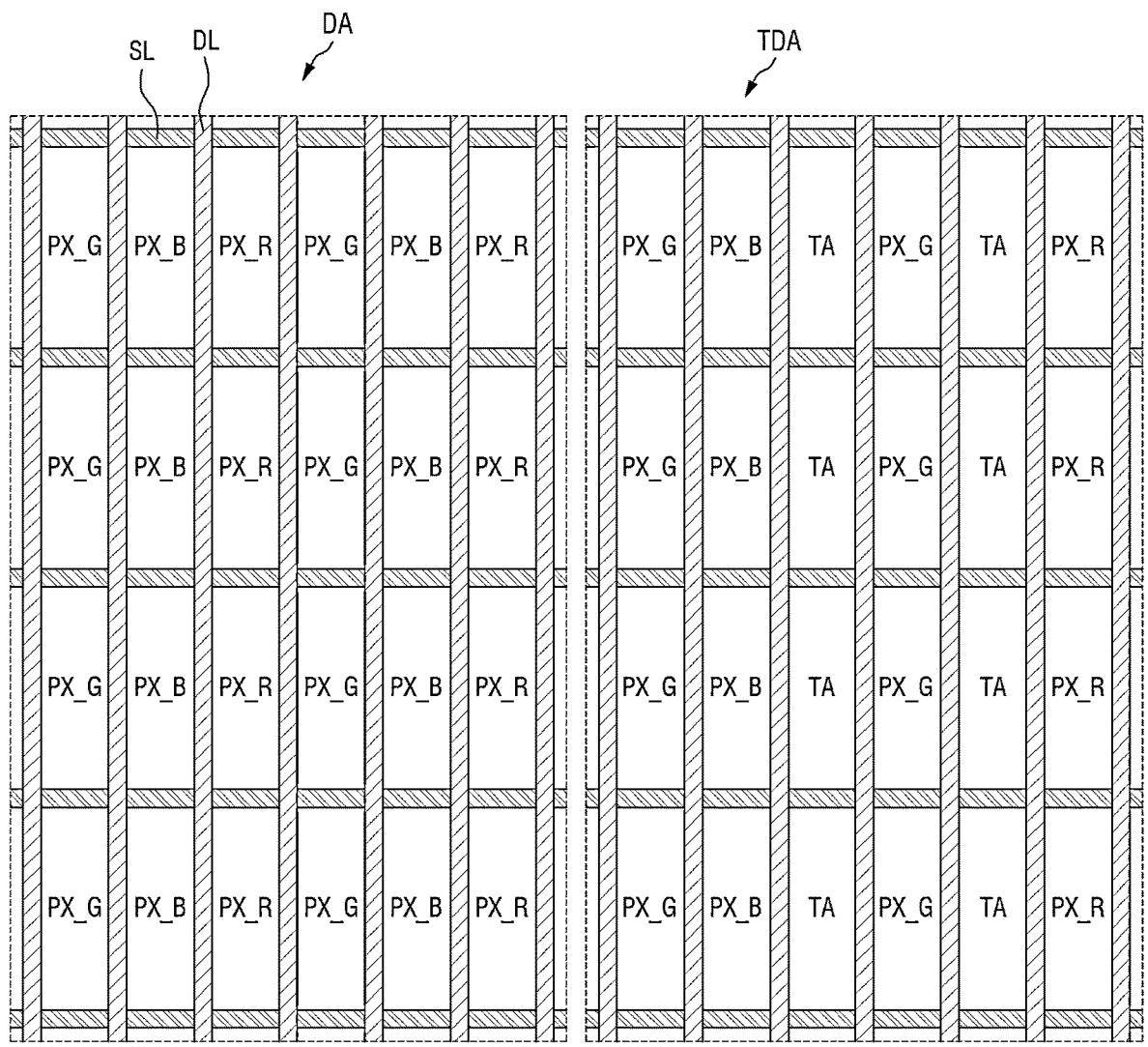
Figure 29:
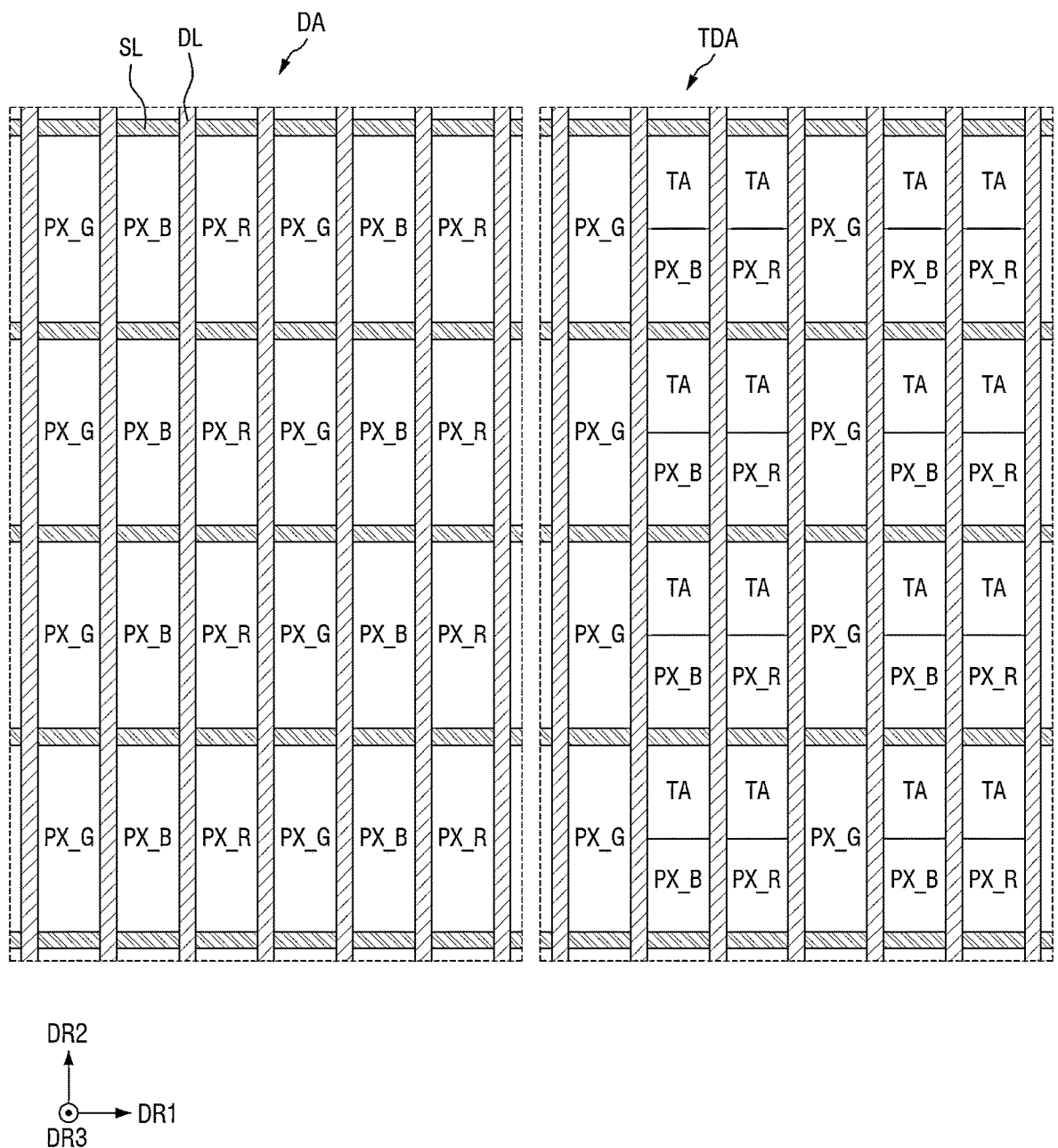

FIGS. 27 to 29 are schematic views illustrating an arrangement of pixels in a partial area of a light transmission display area and a partial area of a light blocking display area of a display panel according to some embodiments.

Referring to FIG. 27, the light transmission display area TDA may have a light transmittance higher than that of the light blocking display area DA. The light blocking display area DA may have a light reflectance higher than that of the light transmission display area TDA.

In the light blocking display area DA, the green pixels PX_G, the blue pixels PX_B, and the red pixels PX_R may be alternately located in the order of the green pixel PX_G, the blue pixel PX_B, and the red pixel PX_R in the first direction DR1. In the light blocking display area DA, the green pixels PX_G may be arranged in the second direction DR2, the blue pixels PX_B may be arranged in the second direction DR2, and the red pixels PX_R may be arranged in the second direction DR2.

In the light transmission display area TDA, the green pixels PX_G, the blue pixels PX_B, and the red pixels PX_R may be alternately arranged in the order of the green pixel PX_G, the red pixel PX_R, the green pixel PX_G, and the blue pixel PX_B in the first direction DR1. In the light transmission display area TDA, the green pixels PX_G may be arranged in the second direction DR2, the blue pixels PX_B may be arranged in the second direction DR2, and the red pixels PX_R may be arranged in the second direction DR2.

In the light transmission display area TDA, a light transmitting portion TA may be located between the green pixel PX_G and the red pixel PX_R located adjacent to a right side of the green pixel PX_G in the first direction DR1. In addition, in the light transmission display area TDA, a light transmitting portion TA may be located between the green pixel PX_G and the blue pixel PX_B located adjacent to a left side of the green pixel PX_G in the first direction DR1.

As illustrated in FIG. 27, the light transmitting portions TA may not overlap each other in the second direction DR2. Alternatively, as illustrated in FIG. 28, the light transmitting portions TA may also extend in the second direction DR2.

Due to the light transmitting portions TA, the number of red pixels PX_R and blue pixels PX_B in the light transmission display area TDA may be smaller than the number of green pixels PX_G. Therefore, by increasing the maximum luminance of the red pixels PX_R and the maximum luminance of the blue pixels PX_B in the light transmission display area TDA to be higher than the maximum luminance of the red pixels PX_R and the maximum luminance of the blue pixels PX_B in the light blocking display area DA, a phenomenon in which a luminance of light emitted from the light transmission display area TDA is lower than that of light emitted from the light blocking display area DA may be minimized.

Scan lines SL extending in the first direction DR1 and data lines DL extending in the second direction DR2 may be located in the light blocking display area DA and the light transmission display area TDA. A light transmittance of the scan lines SL and a light transmittance of the data lines DL in the light transmission display area TDA may be higher than a light transmittance of the scan lines SL and the light transmittance of the data lines DL in the light blocking display area DA.

For example, the scan lines SL and the data lines DL in the light transmission display area TDA may be transparent conductive oxides such as ITO and IZO, or may be a semi-transmissive conductive material such as magnesium (Mg), silver (Ag), or an alloy of magnesium (Mg) and silver (Ag). In comparison, the scan lines SL and the data lines DL in the light blocking display area DA may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

In summary, in the light transmission display area TDA, because light is transmitted through the light transmitting portions TA and simultaneously through the scan lines SL and data lines DL, the light transmittance of the light transmission display area TDA may be higher than that of the light blocking display area DA.

Alternatively, as illustrated in FIG. 29, by reducing an area of the red pixel PX_R and an area of the blue pixel PX_B compared to an area of the green pixel PX_G in the light transmission display area TDA, the light transmitting portion TA may be secured.

As illustrated in FIGS. 27 to 29, when the light transmittance of the light transmission display area TDA is higher than that of the light blocking display area DA, the light transmission control layer 40 and the light transmission control unit 900 are not separately required. Therefore, the light transmission control layer 40 and the light transmission control unit 900 may be omitted.

In concluding the detailed description, those skilled in the art will appreciate that many variations and modifications can be made to the example embodiments without substantially departing from the principles of the present invention. Therefore, the disclosed embodiments of the invention are used in a generic and descriptive sense only and not for purposes of limitation.

What is claimed is:
1. A display device including a first non-folding area, a second non-folding area, a third non-folding area, and a fourth non-folding area, and is that configured to be in-folded based on folding lines between the first non-folding area, the second non-folding area, the third non-folding area, and the fourth non-folding area, the display device comprising:
- a display panel including a light transmission display area in a portion of the first to third non-folding areas, and a light blocking display area in remaining areas of the first to third non-folding areas;
- a light transmission control layer in the light blocking display area; and
- a main processor configured to control the light transmission control layer and the display panel,
- wherein the main processor is configured to output a flat image in a first mode and to display a hologram image in a second mode.

2. The display device of claim 1, wherein the display panel includes a pixel and a light transmitting portion, and
the light transmitting portion has a first light transmittance higher than a second light transmittance of the pixel and the light transmitting portion is in the light transmission display area.

3. The display device of claim 2, wherein the light transmission display area includes a plurality of pixels and at least one light transmitting portion.

4. The display device of claim 2, wherein the light blocking display area includes a plurality of pixels and at least one light transmitting portion.

5. The display device of claim 1, wherein the main processor is configured to cause the display device to display an image in the light transmission display area and the light blocking display area in the first mode, and to not display the image in the light transmission display area and the light blocking display area in the second mode.

6. The display device of claim 5, wherein the display panel of the fourth non-folding area includes a display dedicated area including a plurality of pixels.

7. The display device of claim 6, wherein the main processor is configured to cause the display device to display an image in the display dedicated area in the second mode.

8. The display device of claim 6, wherein the display dedicated area does not include a light transmitting portion having a light transmittance higher than that of the pixels.

9. The display device of claim 6, wherein the light transmission control layer is in the display dedicated area.

10. The display device of claim 1, further comprising a reflective module configured to display the hologram image in the second mode,
wherein the reflective module includes:
- a first reflective member adjacent to the first non-folding area;
- a second reflective member adjacent to the second non-folding area; and
- a third reflective member adjacent to the third non-folding area, and the first to third reflective members are adjacent to the fourth non-folding area.

11. A display device including a first non-folding area, a second non-folding area, a third non-folding area, and a fourth non-folding area, and that is configured to be in-folded based on folding lines between the first non-folding area, the second non-folding area, the third non-folding area, and the fourth non-folding area, the display device comprising:
- a display panel including a light transmission display area in a portion of the first to third non-folding areas, and a light blocking display area in remaining areas of the first to third non-folding areas; and
- a light transmission control layer in the light blocking display area,
- wherein the display panel includes a pixel and a light transmitting portion, and the light transmitting portion has a first light transmittance higher than a second light transmittance of the pixel and the light transmitting portion is in the light transmission display area.

12. The display device of claim 11, wherein the light transmission display area includes a plurality of pixels and at least one light transmitting portion.

13. The display device of claim 12, wherein the pixels and the light transmitting portion in the light transmission display area are alternately arranged and have a same area.

14. The display device of claim 12, wherein the light blocking display area includes a plurality of pixels and at least one light transmitting portion.

15. The display device of claim 14, wherein the pixels and the light transmitting portion in the light blocking display area are alternately arranged and have a same area.

16. The display device of claim 12, wherein the light transmission control layer includes a polymer dispersed liquid crystal layer.

17. The display device of claim 11, wherein the display panel of the fourth non-folding area includes a plurality of pixels, and includes a display dedicated area not including the light transmitting portion.

18. The display device of claim 11, further comprising:
- a step compensation layer on the light transmission display area of the display panel; and
- a protective window on the step compensation layer.

19. The display device of claim 18, wherein a thickness of the light transmission control layer is equal to a sum of a thickness of the step compensation layer and a thickness of the protective window.

20. The display device of claim 18, wherein the step compensation layer and the protective window are on the fourth non-folding area.

* * * * *